US009864189B2

(12) United States Patent
Naono

(10) Patent No.: US 9,864,189 B2
(45) Date of Patent: *Jan. 9, 2018

(54) MIRROR DRIVE DEVICE AND DRIVING METHOD THEREOF

(71) Applicant: FUJIFILM Corporation, Tokyo (JP)

(72) Inventor: Takayuki Naono, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/330,452

(22) Filed: Jul. 14, 2014

(65) Prior Publication Data
US 2015/0309307 A1 Oct. 29, 2015

(30) Foreign Application Priority Data

Jul. 17, 2013 (JP) ................................. 2013-148570

(51) Int. Cl.
G02B 26/08 (2006.01)
H01L 41/187 (2006.01)
(Continued)

(52) U.S. Cl.
CPC ........ *G02B 26/0858* (2013.01); *B81B 3/0043* (2013.01); *B81B 7/008* (2013.01);
(Continued)

(58) Field of Classification Search
CPC ............ G02B 26/0858; H01L 41/0933; H01L 41/16–41/1878; H02N 2/147; H02N 2/103; B81B 3/00
See application file for complete search history.

(56) References Cited

U.S. PATENT DOCUMENTS 5,914,803 A 6/1999 Hwang et al.
7,417,780 B2 8/2008 Fujii et al.
(Continued)

FOREIGN PATENT DOCUMENTS

CN 101273478 A 9/2008
JP H11-112048 A 4/1999
(Continued)

OTHER PUBLICATIONS

The extended European search report issued by the European Patent Office dated Nov. 19, 2014, which corresponds to European Patent Application No. 14177044.6-1562 and is related to U.S. Appl. No. 14/330,452.

(Continued)

Primary Examiner — Zachary Wilkes
Assistant Examiner — George G King
(74) Attorney, Agent, or Firm — Studebaker & Brackett PC

(57) ABSTRACT

In a mirror drive device, a first and second actuator sections are arranged on both sides of a mirror supporting section that supports a mirror section so as to sandwich the mirror supporting section. Division of an upper and lower electrodes of each of the first and second actuator sections is performed correspondingly to stress distribution of principal stresses in a piezoelectric body in resonant mode vibration, and a piezoelectric body portion corresponding to positions of a first and third upper electrode sections, and a piezoelectric body portion corresponding to positions of a second and fourth upper electrode sections have stresses in opposite directions to each other. Division of the lower electrodes is performed similar to the upper electrodes, and drive voltages having the same phase can be respectively applied to the upper and lower electrode sections of the piezoelectric body portions that are different due to a division arrangement.

16 Claims, 18 Drawing Sheets

(51) Int. Cl.
*B81B 7/00* (2006.01)
*G02B 26/10* (2006.01)
*B81B 7/02* (2006.01)
*B81B 3/00* (2006.01)
*H01L 41/09* (2006.01)

(52) U.S. Cl.
CPC .............. *B81B 7/02* (2013.01); *G02B 26/105* (2013.01); *H01L 41/1876* (2013.01); *B81B 2201/032* (2013.01); *B81B 2201/042* (2013.01); *B81B 2201/045* (2013.01); *B81B 2203/04* (2013.01); *H01L 41/0933* (2013.01)

(56) References Cited

U.S. PATENT DOCUMENTS

| | | | |
|---|---|---|---|
| 7,518,287 | B2 | 4/2009 | Hirasawa et al. |
| 7,619,798 | B2 | 11/2009 | Matsuda |
| 7,864,390 | B2 | 1/2011 | Mizumoto |
| 8,354,777 | B2 | 1/2013 | Arakawa et al. |
| 2008/0081215 | A1* | 4/2008 | Fujii .................... B41J 2/161 428/697 |
| 2008/0198433 | A1* | 8/2008 | Ueyama ............. G02B 26/0858 359/198.1 |
| 2009/0267998 | A1 | 10/2009 | Sakashita et al. |
| 2009/0302716 | A1* | 12/2009 | Ohara ................... H01L 41/047 310/363 |
| 2010/0014143 | A1 | 1/2010 | Kanno et al. |
| 2010/0079552 | A1* | 4/2010 | Arakawa ................ B41J 2/155 347/68 |
| 2010/0195180 | A1* | 8/2010 | Akanuma et al. . G02B 26/0858 359/200.8 |
| 2010/0245966 | A1* | 9/2010 | Yasuda ............... H01L 41/0953 359/224.1 |
| 2011/0141538 | A1* | 6/2011 | Mizumoto ......... G02B 26/0841 359/224.1 |
| 2012/0250127 | A1 | 10/2012 | Naono |
| 2013/0128328 | A1 | 5/2013 | Honda et al. |
| 2014/0355088 | A1 | 12/2014 | Yasuda et al. |

FOREIGN PATENT DOCUMENTS

| | | |
|---|---|---|
| JP | 2005-128147 A | 5/2005 |
| JP | 2007-206480 A | 8/2007 |
| JP | 2008-040240 A | 2/2008 |
| JP | 2009-002978 A | 1/2009 |
| JP | 2010-026069 A | 2/2010 |
| JP | 2010-192585 A | 9/2010 |
| JP | 2010-197994 A | 9/2010 |
| JP | 2011-075955 A | 4/2011 |
| JP | 2011-150055 A | 8/2011 |
| JP | 2012-208352 A | 10/2012 |
| JP | 2014-232180 A | 12/2014 |
| WO | 2012/014666 A1 | 2/2012 |

OTHER PUBLICATIONS

The extended European search report issued by the European Patent Office dated Nov. 24, 2014, which corresponds to European Patent Application No. 14177045.3-1562 and is related to U.S. Appl. No. 14/330,415 and U.S. Appl. No. 14/330,452.

M. Tani et al., "A Combination of Fast Resonant Mode and Slow Static Deflection of SOI-PZT Actuators for MEMS Image Projection Display", Optical MEMS and Their Applications Conference, 2006. IEEE/LEOS International Conference 2006, 25-26.

H. Matsuo et al., "Novel Design for Optical Scanner with Piezoelectric Film Deposited by Metal Organic Chemical Vapor Deposition", Japanese Journal of Applied Physics, 49 (2010) 04DL19.

An Office Action; "Notification of Reasons for Rejection," issued by the Japanese Patent Office dated Apr. 14, 2015, which corresponds to Japanese Patent Application No. 2013-148569 and is related to U.S. Appl. No. 14/330,415 and U.S. Appl. No. 14/330,452; with English language partial translation.

An Office Action; "Notification of Reasons for Rejection," issued by the Japanese Patent Office dated Apr. 14, 2015, which corresponds to Japanese Patent Application No. 2013-148570 and is related to U.S. Appl. No. 14/330,452 and U.S. Appl. No. 14/330,415; with English language partial translation.

An Office Action; "Decision of Rejection," issued by the Japanese Patent Office dated Dec. 3, 2015, which corresponds to Japanese Patent Application No. 2013-148569 and is related to U.S. Appl. No. 14/330,415; with English language partial translation.

An Office Action; "Decision of Rejection," issued by the Japanese Patent Office dated Dec. 3, 2015, which corresponds to Japanese Patent Application No. 2013-148570 and is related to U.S. Appl. No. 14/330,452; with English language partial translation.

An Office Action issued by the Chinese Patent Office (SIPO) dated Sep. 18, 2017, which corresponds to Chinese patent Application No. 201410341171.0 and is related to U.S. Appl. No. 14/330,415 and U.S. Appl. No. 14/330,452; with English language translation.

An Office Action issued by the Chinese Patent Office (SIPO) dated Sep. 21, 2017, which corresponds to Chinese Patent Application No. 201410341476.1 and is related to U.S. Appl. No. 14/330,452; with English language translation.

* cited by examiner

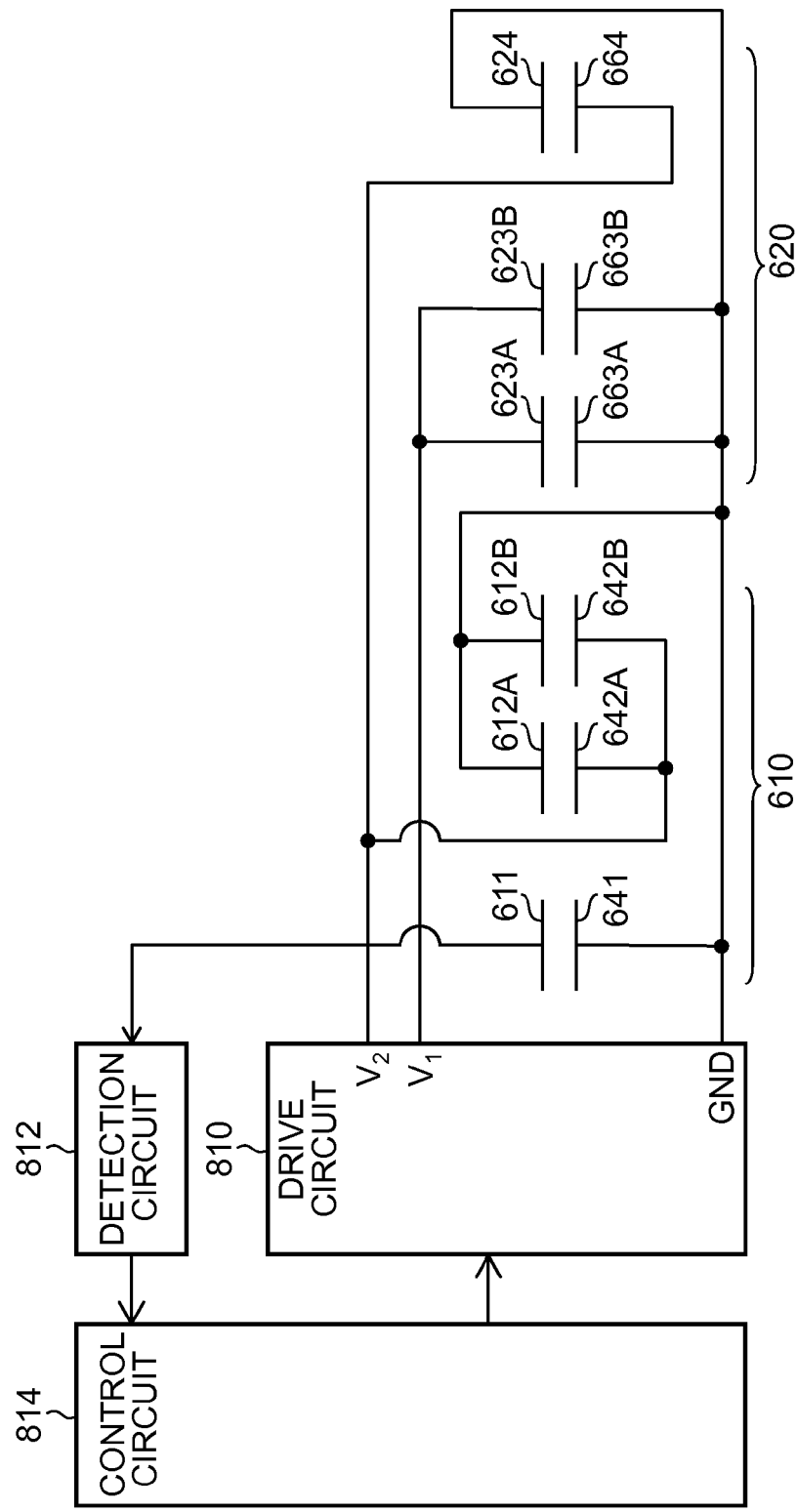

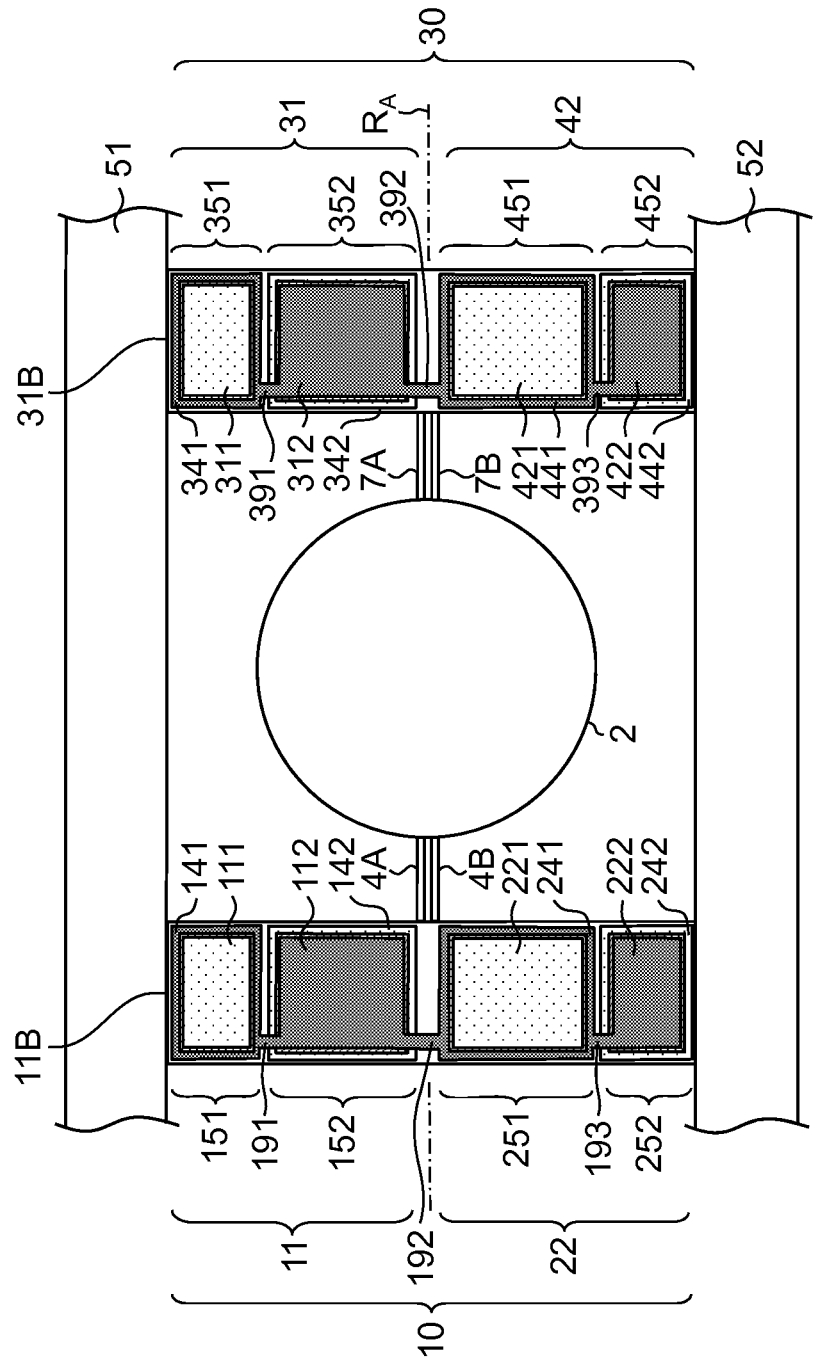

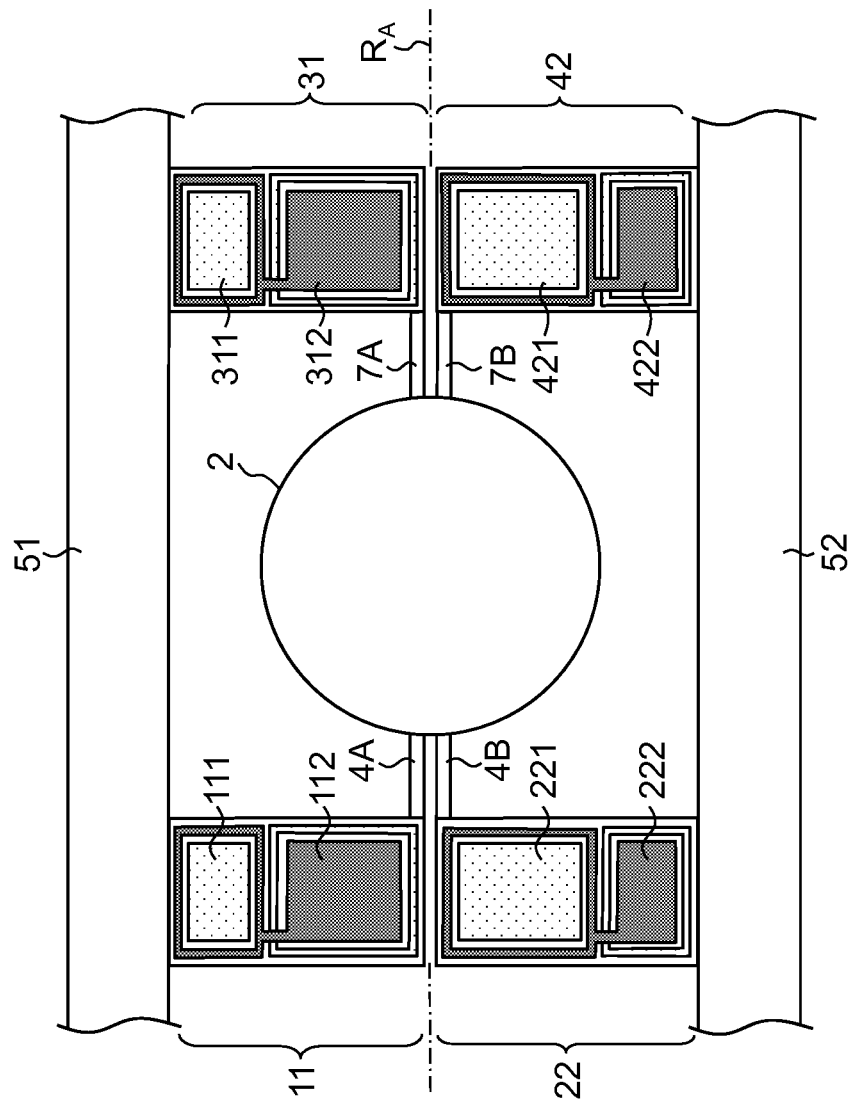

MIRROR DRIVE DEVICE AND DRIVING METHOD THEREOF

CROSS-REFERENCE TO RELATED APPLICATIONS

The present application claims priority under 35 U.S.C. §119 to Japanese Patent Application No. 2013-148570, filed on Jul. 17, 2013. The above application is hereby expressly incorporated by reference, in its entirety, into the present application.

BACKGROUND OF THE INVENTION

Field of the Invention

The presently disclosed subject matter is related to a mirror drive device and a driving method of the mirror drive device, and in particular, related to a structure of a micro mirror device that is suitable for an optical deflector that is used for optical scanning, and a driving method of the micro mirror device.

Description of the Related Art

A micro scanner that is manufactured using a micro process technology of silicon (Si) (hereinafter referred to as "micro electro mechanical system (MEMS) scanner") features a small size and low power consumption, and a wide range of applications from a laser projector to an optical diagnostic scanner such as for optical coherence tomography have been expected.

There are various driving schemes of a MEMS scanner, but a piezoelectric driving scheme using deformation of a piezoelectric body has a high torque density as compared with the other schemes, and obtains a high scan angle with the small size, so that the piezoelectric drive scheme is promising among the various schemes. In particular, in utilization of a laser display, etc. in which a high displacement angle is required, resonance driving is mainly used, and the high torque of the piezoelectric driving scheme is a great advantage for the utilization.

For example, as discussed in Japanese Patent Application Laid-Open No. 2009-002978, in a conventional piezoelectric MEMS scanner, a scheme has mainly been used in which a torsion bar is connected to a coupling section (coupling section) in an actuator having a structure in which two cantilevers are connected, and the respective cantilevers are driven in opposite phases to perform tilting displacement on the torsion bar (see Japanese Patent Application Laid-Open No. 2009-002978; Tani et al., Optical MEMS and Their Applications Conference, 2006. IEEE/LEOS International Conference on, 2006, 25-26; and Matsuo et al., Japanese Journal of Applied Physics, The Japan Society of Applied Physics, 2010, 49, 04DL19).

SUMMARY OF THE INVENTION

However, the piezoelectric MEMS scanner having such a structure cannot convert the piezoelectric torque into tilting displacement effectively, and high voltage of about 40V (volts) is required in order to obtain a sufficient displacement angle.

In addition, when the operation is performed using resonance driving, a sensor (stress detection section) that monitors drive displacement is required in order to keep vibration in a resonant mode, and in this case, it is necessary that one of the cantilevers in the actuator is used as a sensor, so that there is a problem that driving force is significantly reduced to about half.

The presently disclosed subject matter is made in view of such circumstances, and an object of the presently disclosed subject matter is to provide a mirror drive device in which a displacement efficiency can be improved as compared with the conventional structure, and a displacement angle that is large enough can be obtained even when a sensor section is provided, and a driving method of the mirror drive device.

In order to attain such an object, the following aspects of the invention are provided.

(First Aspect)

A mirror drive device according to a first aspect includes a mirror section that includes a reflective surface configured to reflect light, a mirror supporting section that is connected to the mirror section, the mirror supporting section configured to support the mirror section so that the mirror section rotates around a rotating axis, a piezoelectric actuator section that is connected to the mirror supporting section, the piezoelectric actuator section configured to generate a driving force that causes the mirror section to rotate around the rotating axis, and a fixture section configured to support the piezoelectric actuator section, and in the mirror drive device, the piezoelectric actuator section has a lamination structure in which a diaphragm, a lower electrode, a piezoelectric body, and an upper electrode are laminated in this order, and includes a first actuator section and a second actuator section that are piezoelectric unimorph actuators that are deformed by an inverse piezoelectric effect obtained by applying a drive voltage, and the first actuator section is arranged on one side of both sides that sandwich the mirror supporting section, and the second actuator section is arranged on another side thereof, and a first base end section on the opposite side to the mirror supporting section in the first actuator section, and a second base end section on the opposite side to the mirror supporting section in the second actuator section are respectively fixed to the fixture sections, and tilting drive is performed on the mirror supporting section by bending the first actuator section and the second actuator section in opposite directions to each other, and the upper electrode of the first actuator section includes a first upper electrode section and a second upper electrode section, each of which is constituted by one or plurality of electrodes, and the lower electrode of the first actuator section includes a first lower electrode section that faces the first upper electrode section and a second lower electrode section that faces the second upper electrode section, and each of the first lower electrode section and the second lower electrode section is constituted by one or plurality of electrodes, and the first actuator section includes a first piezoelectric conversion section that is constituted by the first upper electrode section and the first lower electrode section as an electrode pair, and a second piezoelectric conversion section that is constituted by the second upper electrode section and the second lower electrode section as an electrode pair, and the upper electrode of the second actuator section includes a third upper electrode section and a fourth upper electrode section each of which is constituted by one or plurality of electrodes, and the lower electrode of the second actuator section includes a third lower electrode section that faces the third upper electrode section and a fourth lower electrode section that faces the fourth upper electrode section, and each of the third lower electrode section and the fourth lower electrode section is constituted by one or plurality of electrodes, and the second actuator section includes a third piezoelectric conversion section that is constituted by the third upper electrode section and the third lower electrode section as an electrode pair, and a fourth piezoelectric conversion section that is constituted by the fourth upper electrode section and the fourth lower electrode section as an electrode pair, and an arrangement configuration of the first upper electrode section, the second upper electrode section, the third upper electrode section, and the fourth upper electrode section corresponds to stress distribution of principal stresses in an in-plane direction that is perpendicular to a film thickness direction of the piezoelectric body in a resonant mode vibration that is associated with tilting displacement of the mirror section due to the rotation around the rotating axis, and stresses in opposite directions to each other are generated between a piezoelectric body portion that corresponds to positions of the first upper electrode section and the third upper electrode section, and a piezoelectric body portion that corresponds to positions of the second upper electrode section and the fourth upper electrode section, in the resonant mode vibration.

In such an aspect, the lower electrode sections of the first actuator section and the second actuator section are arranged to be divided correspondingly to the arrangement configuration of the upper electrode sections. That is, in the mirror drive device according to the first aspect, the upper electrode and the lower electrode are arranged as the divided electrode sections correspondingly to the direction of a stress in the piezoelectric body at the time of driving of the piezoelectric actuator section. Due to such a division arrangement of the electrode sections, driving can be performed efficiently as compare with a structure in the related art, and even when non-resonance driving including direct current (DC) is performed in addition to driving in the resonant mode, a high displacement angle, that is, a mirror inclination angle can be obtained.

In addition, due to the arrangement of the divided electrode sections, drive voltage having the same phase can be applied to the upper electrode sections and the lower electrode sections of the different piezoelectric body portions, and drive control is easily performed. It is noted that, as the piezoelectric actuator section, a unimorph structure is the simplest structure. In the piezoelectric driving scheme, driving can be performed only by applying voltage between electrodes, so that the structure is simple and it is beneficial to downsizing.

(Second Aspect)

In the mirror drive device according to the first aspect, the first actuator section and the second actuator section are coupled to each other, and the mirror supporting section is connected to a coupling section of the first actuator section and the second actuator section.

(Third Aspect)

In the mirror drive device according to the first or second aspect, a drive voltage for piezoelectric driving is applied to at least one of the first lower electrode section, the second lower electrode section, the third lower electrode section, and the fourth lower electrode section.

For example, first drive voltage is applied to the upper electrode section of at least one of the first piezoelectric conversion section and the third piezoelectric conversion section using the lower electrode sections of the first piezoelectric conversion section and the third piezoelectric conversion section as a ground potential, and second drive voltage that has the same phase as the first drive voltage is applied to the lower electrode section of at least one of the second piezoelectric conversion section and the fourth piezoelectric conversion section using the upper electrode sections of the second piezoelectric conversion section and the fourth piezoelectric conversion section as a ground potential. In addition, in the electrode pair that constitutes the piezoelectric conversion section, an electrode section as a ground potential and an electrode section to which drive voltage is applied can be switched.

(Fourth Aspect)

In the mirror drive device according to any one of the first to the third aspects, a first mirror supporting section and a second mirror supporting section that support the mirror section from both sides of the rotating axis in an axial direction, as the mirror supporting section.

(Fifth Aspect)

In the mirror drive device according to any one of the first to fourth aspects, the first actuator section and the second actuator section include cantilever structures in which the first base end section and the second base end section that are fixed to the fixture section are used as fixture ends.

(Sixth Aspect)

In the mirror drive device according to any one of the first to fourth aspects, the first actuator section and the second actuator section are actuator sections having a tuning-fork shape in which two arm sections that are arranged so as to be divided on both sides of the mirror sections are provided.

(Seventh Aspect)

The mirror drive device according to any one of the first to sixth aspects further includes a drive circuit configured to supply a driving voltage to an electrode that is included in the upper electrode section of at least one of the first piezoelectric conversion section and the third piezoelectric conversion section, and supply a driving voltage to an electrode that is included in the lower electrode section of at least one of the second piezoelectric conversion section and the fourth piezoelectric conversion section, and in the mirror drive device, a phase of the drive voltage that is applied to the electrode that constitutes the upper electrode section of at least one of the first piezoelectric conversion section and the third piezoelectric conversion section is same as a phase of the drive voltage that is applied to the lower electrode section of at least one of the second piezoelectric conversion section and the fourth piezoelectric conversion section.

(Eighth Aspect)

The mirror drive device according to any one of the first to seventh aspects further includes a detection circuit configured to detect voltage that is generated by a piezoelectric effect that is associated with a deformation of a piezoelectric body, from a part, which is set at a floating potential, of the upper electrode sections and the lower electrode sections of the first piezoelectric conversion section, the second piezoelectric conversion section, the third piezoelectric conversion section, and the fourth piezoelectric conversion section.

(Ninth Aspect)

The mirror drive device according to any one of the first to eighth aspects further includes a drive circuit configured to supply a drive voltage to the piezoelectric actuator section, and supply the drive voltage that causes resonance driving of the mirror section near a resonant frequency fx of a resonant mode in which the mirror section performs rotation movement around the rotating axis.

In the aspect, a mirror section can be vibrated with a large rotation angle using rotational resonance.

(Tenth Aspect)

In the mirror drive device according to any one of the first to ninth aspects, the piezoelectric body that is used for the piezoelectric actuator section is a thin film that has 1 to 10 μm thickness, and is a thin film that is obtained by performing film-forming directly on a substrate that is a diaphragm.

In the aspect, by using a vapor-phase growth method that is represented by a sputtering method and a direct deposition method such as sol-gel method, a piezoelectric body thin film having required piezoelectric performance can be obtained. A manufacturing process of a device can be simplified by performing film-forming of a thin film of the piezoelectric body directly on a substrate, and processing the thin film by a semiconductor process such as dry etching or wet etching.

(Eleventh Aspect)

In the mirror drive device according to any one of the first to tenth aspects, the piezoelectric body that is used for the piezoelectric actuator section is one or more kinds of perovskite-type oxides that are represented by the following formula (P).

General formula ABO$_3$      (P)

In the formula, "A" is an element of A-site, and at least one element including Pb.

"B" is an element of B-site, and at least one type of element selected from a group including Ti, Zr, V, Nb, Ta, Sb, Cr, Mo, W, Mn, Sc, Co, Cu, In, Sn, Ga, Zn, Cd, Fe, and Ni.

"O" is an oxygen element.

a standard molar ratio between the A-site element, the B-site element, and the oxygen element is 1:1:3, but a molar ratio may be deviated from the standard molar ratio within a range in which a perovskite structure can be obtained.

(Twelfth Aspect)

In the mirror drive device according to any one of the first to tenth aspects, the piezoelectric body that is used for the piezoelectric actuator section is one or more kinds of perovskite-type oxides that are represented by the following formula (PX).

$A_a(Zr_x,Ti_y,M_{b-x-y})_bO_c$      (PX)

In the formula, "A" is an element of A-site, and at least one element including Pb.

"M" is at least one type of element selected from a group including V, Nb, Ta, and Sb.

"0<x<b", "0<y<b", and "0≤b-x-y" are satisfied.

"a:b:c=1:1:3" is a standard molar ratio, but a molar ratio may be deviated from the standard molar ratio within the range in which the perovskite structure can be obtained.

PZT that is doped with the element such as Nb has a high piezoelectric constant, so that the PZT is suitable for manufacturing a device that has a small size and can obtain large displacement. It is noted that a piezoelectric material that is the same as the piezoelectric actuator section can be used for the piezoelectric body that is used as a stress detection section as well.

(Thirteenth Aspect)

In the mirror drive device according to the twelfth aspect, the perovskite-type oxide (PX) includes Nb, and "Nb/(Zr+Ti+Nb)" molar ratio is 0.06 or more to 0.20 or less.

Such a material has an excellent piezoelectric characteristic without polarization treatment. Thus, the polarization treatment is unnecessary, and simplification of the manufacturing process and cost reduction can be achieved.

(Fourteenth Aspect)

A mirror driving method in the mirror drive device according to any one of the first to thirteenth aspects includes bending the first actuator section and the second actuator section in opposite directions to each other by applying the first drive voltage to an electrode that is included in at least one of the first piezoelectric conversion section and the third piezoelectric conversion section, and applying the second drive voltage that has a same phase as the first drive voltage, to an electrode that is included in at least one of the second piezoelectric conversion section and the fourth piezoelectric conversion section.

(Fifteenth Aspect)

In the mirror driving method according to the fourteenth aspect, a part of the upper electrode sections and the lower electrode sections of the first piezoelectric conversion section, the second piezoelectric conversion section, the third piezoelectric conversion section, and the fourth piezoelectric conversion section are used as a detection electrode that detects a voltage that is generated by a piezoelectric effect that is associated with a deformation of the piezoelectric body, and a detection signal is obtained from the detection electrode during driving of the mirror section.

For example, at least one of amplitude and a frequency of drive voltage that is supplied to the piezoelectric actuator section (drive frequency) is controlled based on the detection signal that is obtained from the detection electrode. Stable resonance driving can be obtained by feeding back the detection signal to driving of the piezoelectric actuator section.

In the presently disclosed subject matter, the electrode section is arranged correspondingly to distribution of stresses that are generated in the piezoelectric body at the time of deformation of the actuator section, so that driving can be performed efficiently, and a larger mirror inclination angle can be obtained as compared with the structure in the related art. In addition, the displacement efficiency is improved, so that a sufficient displacement angle can be obtained even when the part of electrodes is used for the detection.

In addition, in the presently disclosed subject matter, driving can be performed so that the first actuator section and the second actuator section are bent in opposite directions using drive voltages having the same phase, so that control of the driving is performed easily.

BRIEF DESCRIPTION OF THE DRAWINGS

FIG. 26 is a diagram illustrating an example of a drive control system in the configuration in FIG. 18;

FIG. 27 is a plan view illustrating a modification of the first embodiment (FIG. 1); and FIG. 28 is a plan view illustrating another modification of the first embodiment (FIG. 1).

DETAILED DESCRIPTION OF THE EMBODIMENTS

The embodiments according to the presently disclosed subject matter are described below with reference to accompanying drawings.

<First Embodiment>

Figure 1:
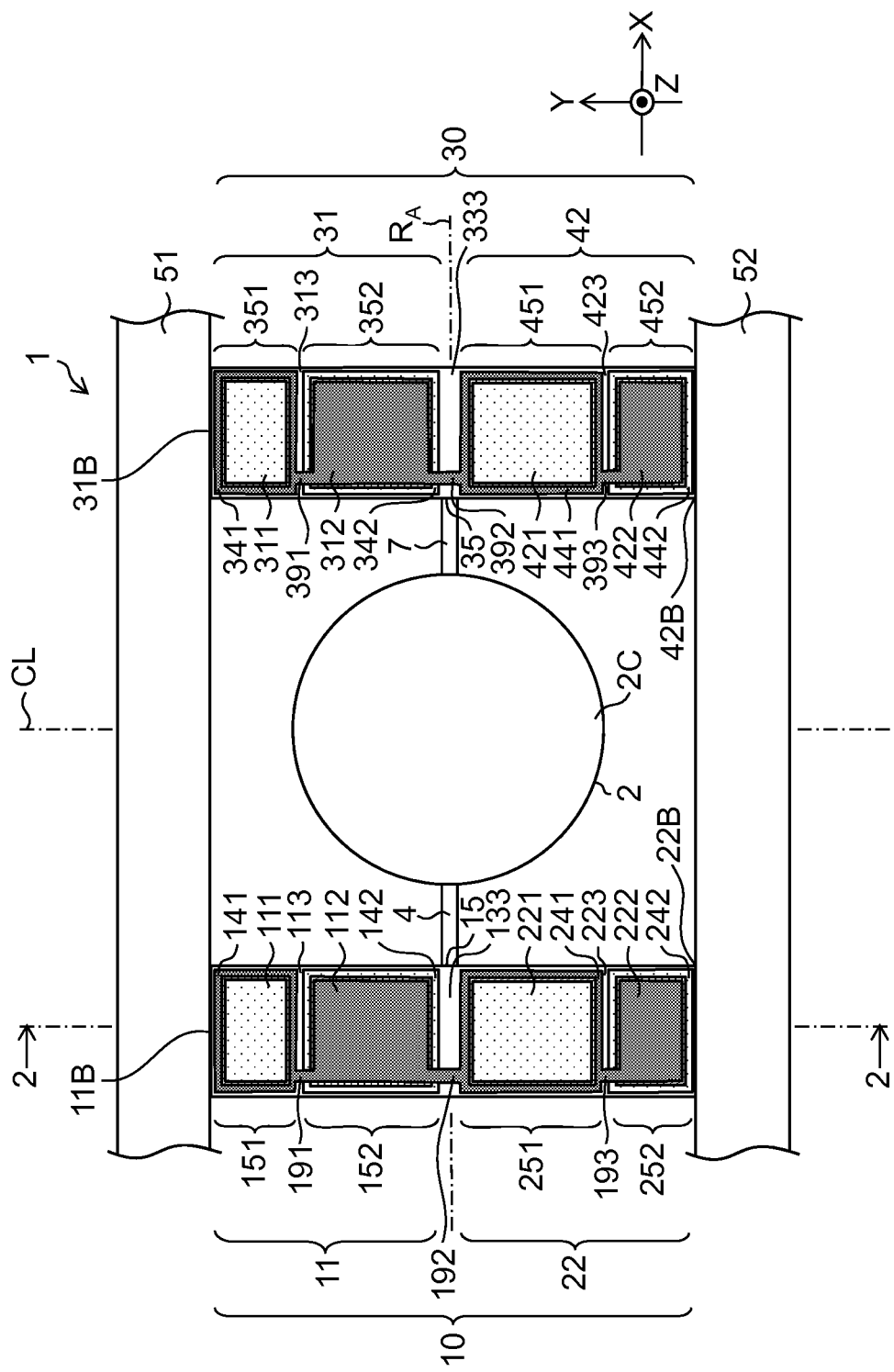
FIG. 1 is a plan view illustrating a structure of a micro scanner device according to a first embodiment.

FIG. 1 is a plan view of a structure of a micro scanner device according to a first embodiment. In this example, in a plan view, a micro scanner device 1 that corresponds to "mirror drive device" includes a mirror section 2 having a circular shape, a first torsion bar section 4 and a second torsion bar section 7 that support the mirror section 2 from both sides of the diameter direction, a first actuator section 11 and a second actuator section 22 that are connected to the first torsion bar section 4 and operate as a piezoelectric actuator section 10, a third actuator section 31 and a fourth actuator section 42 that are connected to a second torsion bar section 7 and operate as a piezoelectric actuator section 30.

The first actuator section 11 and the second actuator section 22 are connected to each other through a coupling section 15, and the first torsion bar section 4 is connected to the coupling section 15. Similarly, the third actuator section 31 and the fourth actuator section 42 are connected to each other through a coupling section 35, and the second torsion bar section 7 is connected to the coupling section 35.

In addition, the micro scanner device 1 includes a first fixture member 51 to and by which a base end section 11B that is an end portion on the opposite side to the coupling section 15 of the first actuator section 11 is fixed and supported and a second fixture member 52 to and by which a base end section 22B that is an end portion on the opposite side to the coupling section 15 of the second actuator section 22 is fixed and supported.

Similarly, a base end section 31B on the opposite side to the coupling section 35 of the third actuator section 31 is fixed to the first fixture member 51, and a base end section 42B on the opposite side to the coupling section 35 of the fourth actuator section 42 is fixed to the second fixture member 52. It is noted that the first fixture member 51 and the second fixture member 52 can be a part of a fixture frame member in which members are connected to each other integrally through a member element that is not illustrated.

The first torsion bar section 4 and the second torsion bar section 7 are members that supports the mirror section 2 rotatably, and correspond "mirror supporting section", and the first torsion bar section 4 corresponds to "first mirror supporting section", and the second torsion bar section 7 corresponds to "second mirror supporting section". The base end sections 11B and 31B correspond to "first base end section", the base end sections 22B and 42B correspond to "second base end section". The first fixture member 51 and the second fixture member 52 correspond to "fixture section".

For convenience of description of the embodiment, x, y, and z axes that are perpendicular to each other is described in which a normal line direction of the mirror surface (reflective surface 2C) at the time of non-driving of the piezoelectric actuator sections 10 and 30 is set as a z axis direction (direction perpendicular to the plane of FIG. 1), and a direction that is parallel to a rotating axis (main axis) $R_A$ of the mirror section 2 by the first torsion bar section 4 and the second torsion bar section 7 (horizontal direction parallel to the plane of FIG. 1) is set as a x axis direction, and a direction that is perpendicular to both the x axis and the z axis (vertical direction parallel to the plane of FIG. 1) is set as a y axis direction.

The micro scanner device 1 is parallel to the y axis and has a structure of a line symmetry (left-right symmetry) generally with respect to the center line CL that passes through the center of the mirror section 2. Due to the symmetry on such a structure, the first actuator section 11 and the third actuator section 31 have the same the structure and function, and the structures and functions of the second actuator section 22 and the fourth actuator section 42 are in common. That is, the third actuator section 31 and the fourth actuator section 42 have structures that are respectively similar to the first actuator section 11 and the second actuator section 22, and the third actuator section 31 corresponds to "first actuator section", and the fourth actuator section 42 correspond to "second actuator section".

The upper surface of the mirror section 2 is a reflective surface 2C that reflects light. On the reflective surface 2C, a metal thin film such as Au (gold) and Al (aluminum) is formed in order to improve a reflectance of incident light. The material and film thickness that are used for mirror coating are not limited, and various designs can be made using a known mirror material (high reflectance material). The planar shape of the mirror section 2 that functions as a reflection section and the shape of the reflective surface 2C may correspond to each other, or may be different from each other. The reflective surface 2C can be formed within an area range of the upper surface of the mirror section 2.

<Shape of the Mirror Section>

In this example, the mirror section 2 having a circular shape is illustrated, but in the embodiments, the shape of the mirror section 2 is not particularly limited. Instead of the circular shape illustrated in FIG. 1, various shapes such as oval, square, or polygon shape can be employed.

In the shape of the mirror section 2, the representation of the circular, oval, rectangle (square) shapes, etc. means that, the shape can be regarded as the basic overall shape of these configurations substantially regardless of the shape in the strict mathematical definition. For example, a rectangle shape the corners of which are chamfered, a rectangle shape the corners are rounded, a shape in which a part or all of lines are constituted by a curve and a polygonal line, a shape to which an additional shape is added that is required for a connection portion of the mirror section 2, and the first torsion bar section 4 and the second torsion bar section 7.

<Structure of the Piezoelectric Actuator Section>

The first actuator section 11 and the second actuator section 22 are coupled to each other in the y axis direction so that the axes of the respective longitudinal directions are matched to each other. The first torsion bar section 4 is connected to the coupling section 15 of the first actuator section 11 and the second actuator section 22. That is, the coupling section 15 is a connection portion between the first actuator section 11 and the second actuator section 22, and a connection portion between the first actuator section 11, the second actuator section 22, and the first torsion bar section 4. The first actuator section 11 and the second actuator section 22 are arranged on the both sides of the y axis direction (both upper and lower sides in FIG. 1) across the coupling section 15 to which the first torsion bar section 4 is connected. In FIG. 1, the first actuator section 11 is arranged on one of both sides in the y axis direction that sandwiches the coupling section 15 (upper side in FIG. 1), and the second actuator section 22 is arranged on the other side (lower side in FIG. 1).

The first actuator section 11 is a piezoelectric actuator having a cantilever structure in which the base end section 11B that is coupled to the first fixture member 51 is set as a fixture end, and a direction of a line segment that connects the fixture end (base end section 11B) and the coupling section 15 is used as a longitudinal direction.

Similarly, the second actuator section 22 is a piezoelectric actuator having a cantilever structure in which the base end section 22B that is coupled to the second fixture member 52 is set as a fixture end, and a direction of a line segment that connects the fixture end (base end section 22B) and the coupling section 15 is used as a longitudinal direction. That is, the coupling section 15 to which the first torsion bar section 4 is connected corresponds to an end portion (displacement section) on the non-binding side in the cantilever structure, which is displaced due to driving of the first actuator section 11 and the second actuator section 22.

Tilting drive of the coupling section 15 and the first torsion bar section 4 can be performed by bending the first actuator section 11 and the second actuator section 22 that are connected to the first torsion bar section 4 through the coupling section 15 in opposite directions to each other as described above. When the driving is performed so that the first actuator section 11 and the second actuator section 22 are bent in the opposite directions to each other, tilting displacement is induced to the coupling section 15 and the first torsion bar section 4, and the mirror section 2 is rotated around a rotating axis $R_A$ (reflective surface 2C of the mirror section 2 is tilted). The rotating axis $R_A$ of the mirror section 2 is an axis that is parallel to the x axis and passes through the center of the mirror section 2.

<<Arrangement Configuration of the Electrode Section>>

Figure 2:
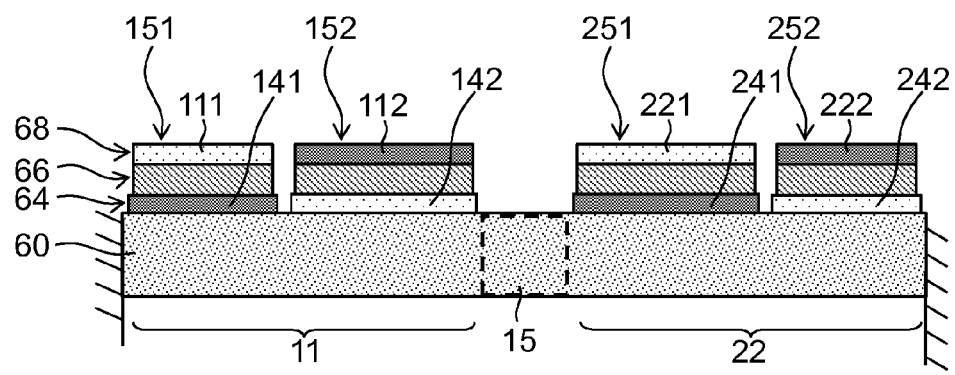
FIG. 2 is a cross-sectional view taken along a line 2-2 in FIG. 1.

FIG. 2 is a cross-sectional view taken along the line 2-2 in FIG. 1. In FIG. 2, the cross-sectional view of a portion of the first actuator section 11 and the second actuator section 22 is illustrated, and the illustration of a portion of the first fixture member 51 and the second fixture member 52 is omitted.

As illustrated in FIG. 2, each of the first actuator section 11 and the second actuator section 22 is a unimorph type thin film piezoelectric actuator having a lamination structure in which a lower electrode 64, a piezoelectric body 66, and an upper electrode 68 are laminated in this order on a substrate of silicon (Si) that functions as a diaphragm 60.

The upper electrode 68 of the first actuator section 11 has an electrode arrangement structure by an electrode division configuration in which division into two parts of a first upper electrode section 111 and a second upper electrode section 112 is performed for the longitudinal direction of the actuator (see FIG. 1). The first upper electrode section 111 and the second upper electrode section 112 are electrodes that are independent of (insulated and separated from) each other. That is, the first actuator section 11 has a structure in which the first upper electrode section 111 and the second upper electrode section 112 are arranged side by side so as to sandwich an insulation section 113 along the length direction (y axis direction in FIG. 1) of the cantilever portion having a length from the base end section 11B as the fixture end of the cantilever structure to the coupling section 15 as the displacement distal end section on the non-binding side.

In addition, in the lower electrode 64 of the first actuator section 11, division into two parts of a first lower electrode section 141 and a second lower electrode section 142 is also performed correspondingly to the divided electrode arrangement of the upper electrode 68. The first lower electrode section 141 and the second lower electrode section 142 are electrodes that are independent of (insulated and separated from) each other. The first upper electrode section 111 and the first lower electrode section 141 have a positional relationship so as to be opposite to each other across the piezoelectric body 66 (see FIG. 2). A first piezoelectric conversion section 151 that functions as a piezoelectric element section is constituted by a lamination structure in which the piezoelectric body 66 lies between the first upper electrode section 111 and the first lower electrode section 141. In the first piezoelectric conversion section 151, a pair of the first upper electrode section 111 and the first lower electrode section 141 functions as an electrode pair.

Similarly, the second upper electrode section 112 and the second lower electrode section 142 have a positional relationship so as to be opposite to each other across the piezoelectric body 66 (see FIG. 2). A second piezoelectric conversion section 152 is constituted by a lamination structure in which the piezoelectric body 66 lies between the second upper electrode section 112 and the second lower electrode section 142. In the second piezoelectric conversion section 152, a pair of the second upper electrode section 112 and the second lower electrode section 142 functions as an electrode pair.

The second actuator section 22 also has an electrode arrangement structure that is similar to that of the first actuator section 11. That is, the upper electrode 68 of the second actuator section 22 has an electrode arrangement structure by an electrode division configuration in which division into two parts of a third upper electrode section 221 and a fourth upper electrode section 222 is performed for the longitudinal direction of the actuator. That is, the second actuator section 22 has a structure in which the third upper electrode section 221 and the fourth upper electrode section 222 are arranged side by side so as to sandwich an insulation section 223 along the length direction (y axis direction in FIG. 1) of the cantilever portion having a length from the base end section 22B as the fixture end of the cantilever structure to the coupling section 15 as the displacement distal end section on non-binding side. The third upper electrode section 221 and the fourth upper electrode section 222 are electrodes that are independent of (insulated and separated from) each other.

In the lower electrode 64 of the second actuator section 22, division into two parts of a third lower electrode section 241 and a fourth lower electrode section 242 is also performed correspondingly to the divided electrode arrangement of the upper electrode. The third lower electrode section 241 and the fourth lower electrode section 242 are electrodes that are independent of (insulated and separated from) each other. The third upper electrode section 221 and the third lower electrode section 241 have a positional relationship so as to be opposite to each other across the piezoelectric body 66. A third piezoelectric conversion section 251 is constituted by a lamination structure in which the piezoelectric body 66 lies between the third upper electrode section 221 and the third lower electrode section 241. In the third piezoelectric conversion section 251, a pair of the third upper electrode section 221 and the third lower electrode section 241 functions as an electrode pair.

Similarly, the fourth upper electrode section 222 and the fourth lower electrode section 242 have a positional relationship so as to be opposite to each other across the piezoelectric body 66 (see FIG. 2). A fourth piezoelectric conversion section 252 is constituted by a lamination structure in which the piezoelectric body 66 lies between the fourth upper electrode section 222 and the fourth lower electrode section 242. In the fourth piezoelectric conversion section 252, a pair of the fourth upper electrode section 222 and the fourth lower electrode section 242 functions as an electrode pair.

It is noted that an insulation section 133 is formed between the second upper electrode section 112 of the first actuator section 11 and the third upper electrode section 221 of the second actuator section 22 as well. Similarly, an insulation section is formed between the second lower electrode section 142 of the first actuator section 11 and the third lower electrode section 241 of the second actuator section 22 as well.

However, in the plurality of electrodes sections that is formed so as to be divided as described above, electrode sections to which the same drive voltage is applied, or electrode sections to which the same potential (for example, ground potential as a reference potential) is set are connected to each other through a wiring section as appropriate.

For example, the first upper electrode section 111 and the third upper electrode section 221 (pair), or the second lower electrode section 142 and the fourth lower electrode section 242 (pair) are connected to each other through a wiring section that is not illustrated.

In addition, in the example of FIG. 1, it is assumed that a ground potential (GND) is set to all of the first lower electrode section 141, the second upper electrode section 112, the third lower electrode section 241, and the fourth upper electrode section 222, so that a part of the electrode sections (141, 112, 241, and 222) are connected to each other through each of wiring sections 191, 192, and 193. That is, the first lower electrode section 141 and the second upper electrode section 112 are connected to each other through the wiring section 191, and the second upper electrode 112 and the third lower electrode section 241 are connected to each other through the wiring section 192, and the third lower electrode section 241 and the fourth upper electrode section 222 are connected to each other through the wiring section 193.

It is noted that FIG. 1 illustrates the schematic plan view, but an insulation film (insulation member) that is not illustrated lies between the wiring sections 191, 192, and 193 so that electricity is not conducted between each of the wiring sections 191, 192, and 193 and another piece of wiring in a step portion, etc. of the end face of the piezoelectric body 66. In addition, in FIG. 1, for ease of visual comprehension of the lamination structure of the upper electrode/piezoelectric body/lower electrode, the size of the electrode section, etc. is modified and drawn as appropriate.

In the embodiment, as illustrated in FIG. 2, division of the piezoelectric body 66 is performed correspondingly to the division configures of the upper electrode 68 and the lower electrode 64. That is, division of the lamination structure of the upper electrode/piezoelectric body/lower electrode is performed for each of the first piezoelectric conversion section 151, the second piezoelectric conversion section 152, the third piezoelectric conversion section 251, and the fourth piezoelectric conversion section 252.

In the piezoelectric body 66, a portion that is sandwiched by the upper and lower electrodes functions as a driving force generation section or a stress detection section (sensor section), so that an unnecessary piezoelectric body portion (portion that does not include at least one of the upper and lower electrodes, etc.) that does not directly contribute to an operation as such a piezoelectric conversion section (piezoelectric element section) can be eliminated. When the unnecessary piezoelectric body portion is eliminated and division of the piezoelectric body is performed in a unit of the piezoelectric conversion section, the rigidity of the actuator section is reduced, and the actuator section is deformed easily.

In the embodiment, for the piezoelectric body layer, separation that corresponds to the division configuration of the electrode section (division due to the elimination of the unnecessary portion) is not always requested. The piezoelectric body layer can be also used as a single piezoelectric body film without division in the unit of the piezoelectric conversion section.

In addition, in this example, each of the first upper electrode section 111, the second upper electrode section 112, the third upper electrode section 221, the fourth upper electrode section 222, the first lower electrode section 141, the second lower electrode section 142, the third lower electrode section 241, and the fourth lower electrode section 242 is constituted by a single electrode. However, each of the electrode sections (111, 112, 221, 222, 141, 142, 241, and 242) can be constituted by a plurality of electrodes instead of the configuration in which each of the electrode sections is constituted by a single electrode.

The structures of the third actuator section 31 and the fourth actuator section 42 are similar to those of the first actuator section 11 and the second actuator section 22.

The second torsion bar section 7 is connected to the coupling section 35 of the third actuator section 31 and the fourth actuator section 42. That is, the third actuator section 31 and the fourth actuator section 42 are arranged on both sides of the y axis direction of the coupling section 35 (both upper and lower sides of the coupling section 35 in FIG. 1) to which the second torsion bar section 7 is connected.

The upper electrode of the third actuator section 31 has an electrode arrangement structure by the electrode division configuration in which division into two parts of a fifth upper electrode section 311 and a sixth upper electrode section 312 is performed for the longitudinal direction of the actuator. The fifth upper electrode section 311 and the sixth upper electrode section 312 are electrodes that are independent of (insulated and separated from) each other through an insulation section 313. The upper electrode of the fourth actuator section 42 has also an electrode arrangement structure by the electrode division configuration in which division into two parts of a seventh upper electrode section 421 and an eighth upper electrode section 422 is performed for the longitudinal direction. The seventh upper electrode section 421 and the eighth upper electrode section 422 are electrodes that are independent of (insulated and separated from) each other through an insulation section 423.

The lower electrode of the third actuator section 31 is divided into two parts of a fifth lower electrode section 341 and a sixth lower electrode section 342 correspondingly to the divided electrode arrangement of the upper electrode. The fifth lower electrode section 341 and the sixth lower electrode section 342 are electrodes that are independent of (insulated and separated from) each other. The fifth upper electrode section 311 and the fifth lower electrode section 341 are opposite to each other across the piezoelectric body 66 (see FIG. 2), and a fifth piezoelectric conversion section 351 is constituted by a lamination structure in which the piezoelectric body 66 lies between the fifth upper electrode section 311 and the fifth lower electrode section 341. In the fifth piezoelectric conversion section 351, a pair of the fifth upper electrode section 311 and the fifth lower electrode section 341 functions as an electrode pair.

Similarly, the sixth upper electrode section 312 and the sixth lower electrode section 342 are opposite to each other across the piezoelectric body 66 (see FIG. 2), and a sixth piezoelectric conversion section 352 is constituted by a lamination structure in which the piezoelectric body 66 lies between the sixth upper electrode section 312 and the sixth lower electrode section 342. In the sixth piezoelectric conversion section 352, a pair of the sixth upper electrode section 312 and the sixth lower electrode section 342 functions as an electrode pair.

The lower electrode of the fourth actuator section 42 are also divided into two parts of a seventh lower electrode section 441 and an eighth lower electrode section 442 correspondingly to the divided electrode arrangement of the upper electrode. The seventh lower electrode section 441 and the eighth lower electrode section 442 are electrodes that are independent of (insulated and separated from) each other. The seventh upper electrode section 421 and the seventh lower electrode section 441 are opposite to each other across the piezoelectric body 66 (see FIG. 2), and a seventh piezoelectric conversion section 451 is constituted by a lamination structure in which the piezoelectric body 66 lies between the seventh upper electrode section 421 and the seventh lower electrode section 441. In the seventh piezoelectric conversion section 451, a pair of the seventh upper electrode section 421 and the seventh lower electrode section 441 functions as an electrode pair.

Similarly, the eighth upper electrode section 422 and the eighth lower electrode section 442 are opposite to each other across the piezoelectric body 66 (see FIG. 2), and an eighth piezoelectric conversion section 452 is constituted by a lamination structure in which the piezoelectric body 66 lies between the eighth upper electrode section 422 and the eighth lower electrode section 442. In the eighth piezoelectric conversion section 452, a pair of the eighth upper electrode section 422 and the eighth lower electrode section 442 functions as an electrode pair.

An insulation section 333 is formed between the sixth upper electrode section 312 of the third actuator section 31 and the seventh upper electrode section 421 of the fourth actuator section 42 as well. Similarly, an insulation section is formed between the sixth lower electrode section 342 of the third actuator section 31 and the seventh lower electrode section 441 of the fourth actuator section 42 as well.

In addition, electrode sections to which the same drive voltage is applied or electrode sections to which the same potential is set may be connected to each other through a wiring section as appropriate. In the example of FIG. 1, the fifth lower electrode section 341 and the sixth upper electrode section 312 is connected to each other through a wiring section 391, and the sixth upper electrode section 312 and the seventh lower electrode section 441 are connected to each other through a wiring section 392, and the seventh lower electrode section 441 and the eighth upper electrode section 422 are connected to each other through a wiring section 393.

Each of the fifth upper electrode section 311, the sixth upper electrode section 312, the seventh upper electrode section 421, the eighth upper electrode section 422, the fifth lower electrode section 341, the sixth lower electrode section 342, the seventh lower electrode section 441, and the eighth lower electrode section 442 in this example is constituted by a single electrode. However, each of the electrode sections (311, 312, 421, 422, 341, 342, 441, and 442) can be constituted by a plurality of electrodes instead of the configuration in which each of the electrode sections is constituted by a single electrode.

The fifth upper electrode section 311, the fifth lower electrode section 341, and the fifth piezoelectric conversion section 351 of the third actuator section 31 are elements that respectively correspond to the first upper electrode section 111, the first lower electrode section 141, and the first piezoelectric conversion section 151 of the first actuator section 11.

The sixth upper electrode section 312, the sixth lower electrode section 342, and the sixth piezoelectric conversion section 352 of the third actuator section 31 are element that respectively correspond to the second upper electrode section 112, the second lower electrode section 142, and the second piezoelectric conversion section 152 of the first actuator section 11.

The seventh upper electrode section 421, the seventh lower electrode section 441, and the seventh piezoelectric conversion section 451 of the fourth actuator section 42 are element that respectively correspond to the second upper electrode section 112, the second lower electrode section 142, and the second piezoelectric conversion section 152 of the second actuator section 22.

The description that is related to the first actuator section 11 and the second actuator section 22 are similar to those of the third actuator section 31 and the fourth actuator section 42, so that the first actuator section 11 and the second actuator section 22 are mainly described below, and descriptions that are related to the third actuator section 31 and the fourth actuator section 42 are omitted herein.

Figure 3:
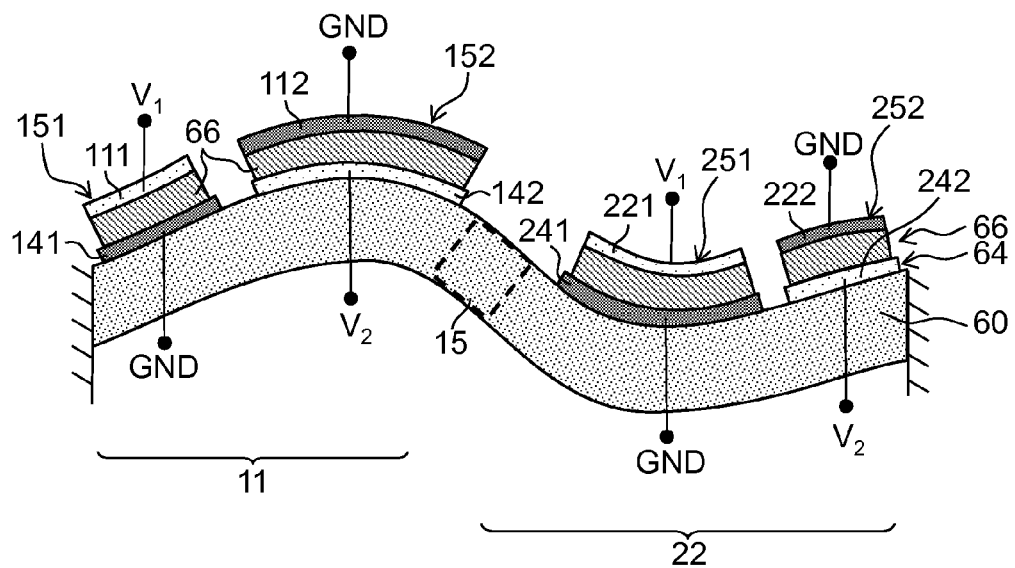
FIG. 3 is a schematic cross-sectional view illustrating a state of deformation of a piezoelectric actuator section when a drive voltage is applied.

As illustrated in FIG. 2, the first actuator section 11 and the second actuator section 22 function as a piezoelectric thin film unimorph actuators that are bent and deformed in the up-down direction of FIG. 2 due to inverse piezoelectric effect of the piezoelectric body 66 when voltage is applied between the upper electrode 68 and the lower electrode 64 that are opposite to each other across the piezoelectric body 66 (see FIG. 3).

It is noted that, for convenience of description, the film thickness of each of the layers and the ratio of the layers in FIG. 2 and the other figures are described so as to be changed as appropriate, and does not always reflect the actual film thickness and ratio. In addition, in this present specification, in the description of the lamination structure, "on" of "lamination of B on A" is matched with to a direction that is away from the surface of "A" in the thickness direction of the film. When "B" is laminated on the upper surface of "A" in a state in which "A" is kept horizontally, the direction corresponds to the upper and lower direction by setting the gravity direction as the downward direction. However, the posture of "A" can be tiled, and "A" can be turned upside down, and even when the lamination direction of the lamination structure that depends on the posture of the substrate and the film is not always matched with the up-down direction using the gravity direction as a reference, a direction that is away from the surface in the thickness direction is caused to correspond to "on" by setting the surface of a member (for example, A) that is a certain reference as a reference in order to represent the upper-lower relationship of the lamination structure without confusion. In addition, the representation of "lamination of B on A" may corresponds to a case in which one or plurality of layers lies between "A" and "B", and "B" is laminated on "A" through the one or plurality of layers instead of the case in which "B" is directly laminated on "A" so as to be in contact with "A".

<Description of an Operation of the Piezoelectric Actuator Section>

FIG. 3 is a schematic cross-sectional view illustrating a state of deformation of the piezoelectric actuator section when drive voltage is applied. In FIG. 3, for the first piezoelectric conversion section 151 and the third piezoelectric conversion section 251 that correspond to a first drive section, driving is performed by setting the first lower electrode section 141 and the third lower electrode section 241 at a ground potential, and applying drive voltage $V_1$ to the first upper electrode section 111 and the third upper electrode section 221, and for the second piezoelectric conversion section 152 and the fourth piezoelectric conversion section 252 that correspond to a second drive section, driving is performed by setting the second upper electrode section 112 and the fourth upper electrode section 222 at a ground potential, and applying drive voltage $V_2$ to the second lower electrode section 142 and the fourth lower electrode section 242.

Figure 4:
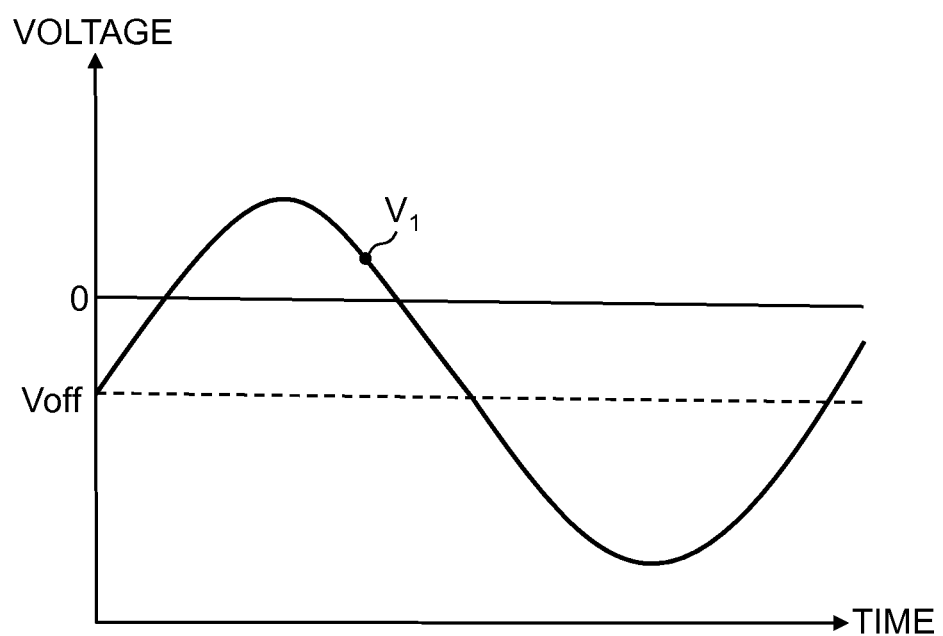
FIG. 4 is a waveform diagram illustrating an example of drive voltage $V_1$.

Here, for ease of explanation, it is assumed that drive voltage $V_{11}$ that is applied to the first upper electrode section 111 and drive voltage $V_{21}$ that is applied to the third upper electrode section 221 are the same drive voltage $V_1$ ($V_{11}=V_{21}=V_1$), and drive voltage $V_{12}$ that is applied to the second lower electrode section 142 and drive voltage $V_{22}$ that is applied to the fourth lower electrode section 242 are the same drive voltage $V_2$ ($V_{12}=V_{22}=V_2$), and the drive voltages $V_1$ and $V_2$ are drive voltages by the waveform of the sine wave in the same phase (see FIG. 4).

The drive voltages $V_1$ and $V_2$ in FIG. 3 are represented as follows.

$$V_1 = V_{off1} + V_{1A} \sin \omega t$$

$$V_2 = V_{off2} + V_{2A} \sin \omega t$$

In the above-described formula, "$V_{1A}$" and "$V_{2A}$" are voltage amplitudes, and "$\omega$" is an angular frequency, and "t" is a time.

"$V_{1A}$" and "$V_{2A}$" can be set as given values of 0 or more ($V_{1A} \geq 0$, $V_{2A} \geq 0$).

The offset voltages "$V_{off1}$" and "$V_{off2}$" are optional, and for example, it is preferable that the drive voltages $V_1$ and $V_2$ are set so as not to exceed polarization reversal voltage of the piezoelectric body.

In FIG. 3, as the drive voltage $V_1$ that is applied to the first upper electrode section 111 and the third upper electrode section 221, and the drive voltage $V_2$ that is applied to the second lower electrode section 142 and the fourth lower electrode section 242, the voltage waveforms of the drive voltages $V_1$ and $V_2$ that satisfy the above-described formulas are applied.

By applying the drive voltage $V_1$ and $V_2$ that have the same phase, bending deformation occurs in the first actuator section 11 and the second actuator section 22 due to the inverse piezoelectric effect of the piezoelectric body 66 (see FIG. 3). As illustrated in FIG. 3, when the first actuator section 11 and the second actuator section 22 are driven so as to respectively correspond to bending directions that are opposite directions to each other for the z direction, tilting displacement occurs in the coupling section 15 of the first actuator section 11 and the second actuator section 22 and the first torsion bar section 4 that is connected to the coupling section 15.

It is noted that, as the simplest example, "$V_1=V_2$" is satisfied, the first actuator section 11 and the second actuator section 22 can be bent in opposite directions to each other using a voltage waveform of one type of drive voltage $V_1$. FIG. 4 is a diagram illustrating an example of a voltage waveform of the drive voltage $V_1$.

For the third actuator section 31 and the fourth actuator section 42 illustrated in FIG. 1, tilting displacement occurs in the coupling section 35 and the second torsion bar section 7 by performing driving similar to the first actuator section 11 and the second actuator section 22.

By performing driving on each of the actuator sections (11, 22, 31, and 42) with a resonant frequency that corresponds to the resonant mode in which tilting displacement occurs in the first torsion bar section 4 and the second torsion bar section 7 that support the mirror section 2, large tilting displacement occurs in the first torsion bar section 4, the second torsion bar section 7, and the mirror section 2, and a wide tilting angle range can be obtained. As a result, a wide range can be scanned.

<Relationship Between an Arrangement Configuration of the Electrode Section and Stress Distribution at the Time of Driving in Resonant Mode Vibration>

Figure 5:
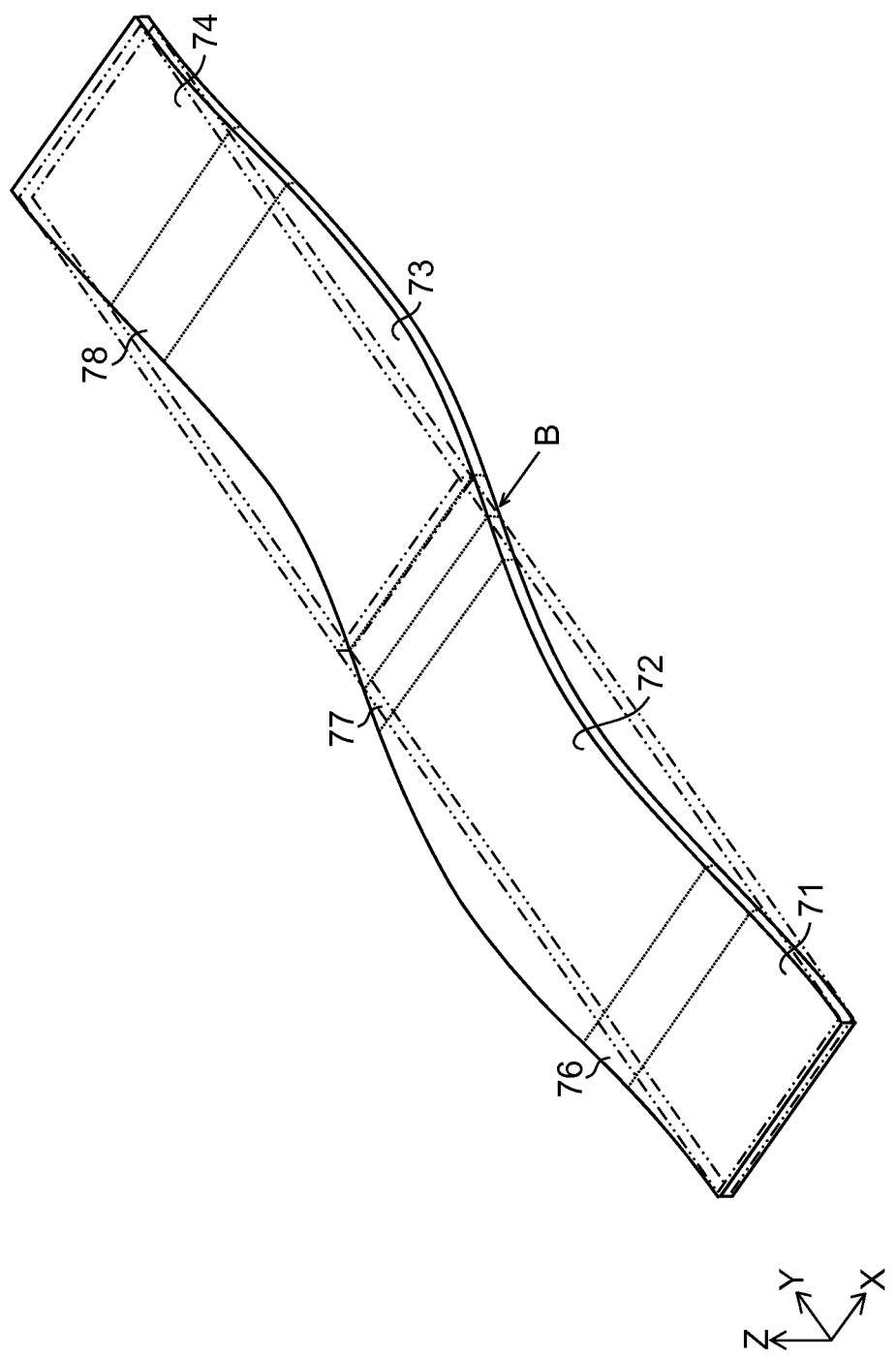
FIG. 5 is a schematic diagram illustrating displacement of a piezoelectric body and a stress distribution of principal stresses at the time of resonance driving.
Figure 6:
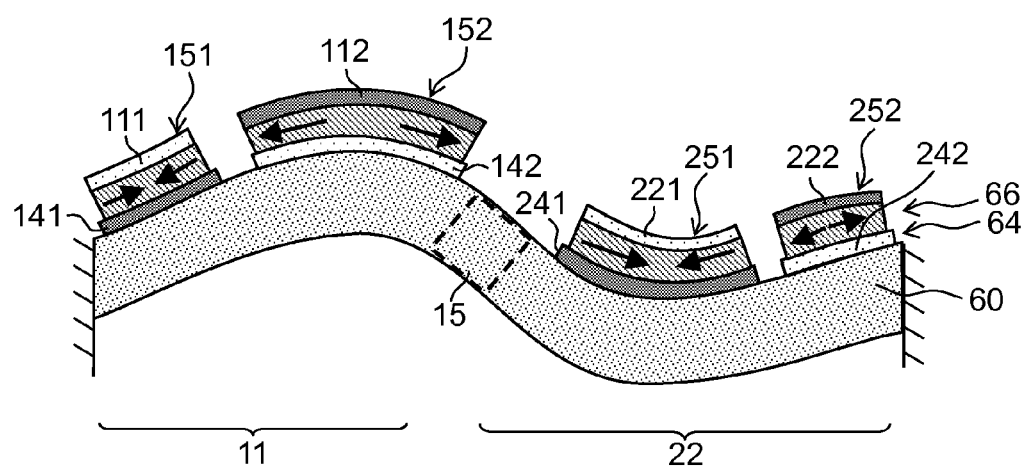
FIG. 6 is a schematic diagram illustrating a stress direction in the piezoelectric body at the time of resonance driving.

FIG. 5 is a schematic diagram illustrating displacement of the piezoelectric body in each of the first actuator section 11 and the second actuator section 22 at the time of resonance driving. In addition, FIG. 6 is a schematic diagram illustrating a direction of a principal stress in each of the first actuator section 11 and the second actuator section 22 at the time of resonance driving.

A portion illustrated by an arrow B in FIG. 5 is a portion that corresponds to the coupling section 15, and a state in which tilting displacement occurs in this portion is illustrated in FIG. 5. When the first actuator section 11 and the second actuator section 22 are in the bending deformation state illustrated in FIGS. 5 and 6 in a driving state by the resonant mode vibration, there are generated a portion to which a stress in a compression direction (compression stress) is applied (reference numerals 71 and 73 in FIG. 5)

and a portion to which a stress in a tensile direction (tensile stress) is applied (reference numerals 72 and 74) in the piezoelectric body 66 inside each of the first actuator section 11 and the second actuator section 22 (see FIG. 5). Division into the upper electrode and the lower electrode is performed based on such stress distribution correspondingly to the segmentation of the piezoelectric body areas in which the stresses are generated in the opposite directions to each other, and each of the upper electrode sections (111, 112, 221, and 222) and each of the lower electrode sections (141, 142, 241, and 242) are arranged.

The stress described herein is a stress generated in the x-y plane when the film thickness direction is set as the z axis, a direction having the largest absolute value of the component from among principal stress vectors in the x-y plane is set as a direction of the stress.

It is noted that, in FIG. 5, in a portion of a boundary (reference numerals 76, 77, and 78) between the portion in which the stress in the compression direction is generated (compression stress areas 71 and 73) and the portion in which the stress in the tensile direction is generated (tensile stress areas 72 and 74), there exists a transitional area (intermediate area) in which a direction of the stress is changed gradually (successively).

For the areas of the piezoelectric body sections (reference numerals 71, 72, 73, and 74) that have different stress directions depending on stress distribution as illustrated in FIG. 5, the first upper electrode section 111, the second upper electrode section 112, the third upper electrode section 221, and the fourth upper electrode section 222 are respectively arranged.

As illustrated in FIG. 5, for the lower electrode as well, the areas of the piezoelectric body sections (reference numerals 71, 72, 73, and 74) that have different stress directions depending on the stress distribution, the first lower electrode section 141, the second lower electrode section 142, the third lower electrode section 241, and the fourth lower electrode section 242 are respectively arranged.

That is, the first upper electrode section 111 and the first lower electrode section 141 are provided for the compression stress area 71 in FIG. 5, and the second upper electrode section 112 and the second lower electrode section 142 are provide for the tensile stress area 72. Similarly, the third upper electrode section 221 and the third lower electrode section 241 are provided for the compression stress area 73, and the fourth upper electrode section 222 and the fourth lower electrode section 242 are provided for the tensile stress area 74. The insulation sections 113, 133, and 223 (see FIG. 1) are formed so as to respectively correspond to the intermediate areas 76, 77, and 78.

For stress distribution at the operation by the resonant mode vibration (at the resonance driving), software of a known finite element method is used, and a parameter such as a device dimension, Young's modulus of a material, and a device shape is given, and analysis can be performed using a mode analysis method. In the design of the device, stress distribution in the piezoelectric body at the driving by the resonant mode is analyzed, and division into the areas of the upper electrode and the lower electrode is performed so as to correspond to the segmentation of the compression stress area and the tensile stress area in the stress distribution based on the analysis result, and the arrangement configuration of the first upper electrode section 111, the second upper electrode section 112, the third upper electrode section 221, and the fourth upper electrode section 222, and the arrangement configuration of the first lower electrode section 141, the second lower electrode section 142, the third lower electrode section 241, and the fourth lower electrode section 242 that are opposite to the above-described sections are determined.

In addition, in terms of a group of the piezoelectric conversion sections that correspond to areas having the same stress direction, the piezoelectric conversion sections can be divided into two groups. The first piezoelectric conversion section 151 and the third piezoelectric conversion section 251 belong to a first group (first electrode group), and the second piezoelectric conversion section 152 and the fourth piezoelectric conversion section 252 belong to a second group (second electrode group).

In the arrangement configuration of the electrode sections that are divided as described above, one of the upper electrode section and the lower electrode section in piezoelectric conversion sections that correspond to areas having the same stress direction (piezoelectric conversion sections in the same group) is set at a ground potential, and drive voltage having the same phase is applied to the other electrode section. In addition, for pressure conversion sections that correspond to areas having the different stress direction (stresses in the opposite directions) (piezoelectric conversion sections that belongs to the different groups), the lower electrode in the piezoelectric conversion section that belongs to one group is set at a ground potential, and the drive voltage $V_1$ is applied to the upper electrode, and the upper electrode in piezoelectric conversion section that belongs to the other group is set at a ground potential, and the drive voltage $V_2$ having the same phase as the drive voltage $V_1$ is applied to the lower electrode, so that piezoelectric power can be converted into tilting displacement the most efficiently.

It is noted that the example is described above in which the drive voltage $V_1$ is applied to the first upper electrode section 111 and the third upper electrode section 221, the drive voltage $V_2$ is applied to the second lower electrode section 142 and the fourth lower electrode section 242, but the embodiment is not limited to such a relationship, and the drive voltage $V_2$ can be applied to the first upper electrode section 111 and the third upper electrode section 221, and the drive voltage $V_1$ can be applied to the second lower electrode section 142 and the fourth lower electrode section 242.

In addition, the first upper electrode section 111 and the third upper electrode section 221 can be set at a ground potential and the drive voltage $V_1$ can be applied to the first lower electrode section 141 and the third lower electrode section 241, and the second lower electrode section 142 and the fourth lower electrode section 242 can be set at a ground potential and the drive voltage $V_2$ can be applied to the second upper electrode section 112 and the fourth upper electrode section 222.

In addition, the configuration is described above in which all of the first piezoelectric conversion section 151, the second piezoelectric conversion section 152, the third piezoelectric conversion section 251, and the fourth piezoelectric conversion section 252 are used as driving force generation sections, but a configuration can be employed in which a part of the piezoelectric conversion sections is used as a sensing (detection) sensor section (stress detection section). In addition, instead of the configuration in which each of the electrode sections (111, 112, 221, 222, 141, 142, 241, and 242) is constituted by a single electrode, at least one of the electrode sections (111, 112, 221, 222, 141, 142, 241, and 242) may be constituted by a plurality of electrodes.

The fifth upper electrode section 311, the sixth upper electrode section 312, the fifth lower electrode section 341, and the sixth lower electrode section 342 of the third actuator section 31, and, the seventh upper electrode section 421, the eighth upper electrode section 422, the seventh lower electrode section 441, and the eighth lower electrode section 442 of the fourth actuator section 42 have arrangements that are respectively similar to the above-described electrode sections (111, 112, 221, 222, 141, 142, 241, and 242).

<Utilization Configuration and Modification of the Device>
(Utility Example 1)

Figure 7:
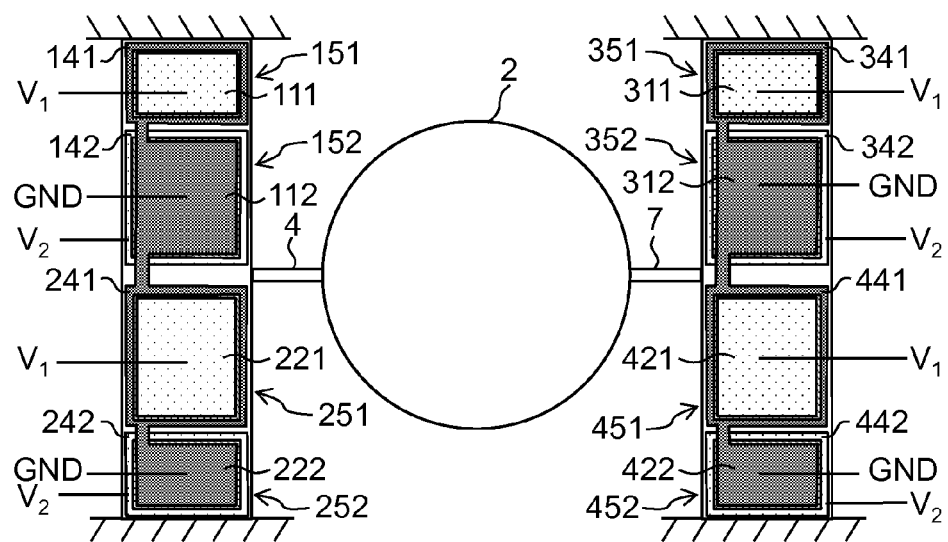
FIG. 7 is a diagram illustrating a voltage application method when all piezoelectric conversion sections are used for driving in the device structure of FIG. 1.

FIG. 7 is a diagram illustrating an example in which all of the first piezoelectric conversion section 151 to the eighth piezoelectric conversion section 452 are used as driving electrodes. A portion in which the piezoelectric body 66 lies between each of the electrode sections (111, 112, 221, 222, 311, 312, 421, and 422) as the upper electrode 68 and each of the electrode sections (141, 142, 241, 242, 341, 342, 441, and 442) as the lower electrode 64 operates as a piezoelectric element section. In this example, all of the electrode sections are used as driving electrodes, and all of the piezoelectric conversion sections 151, 152, 251, 252, 351, 353, 451, and 452 function as driving force generation sections.

In this case, for example, as illustrated in FIG. 7, in the first piezoelectric conversion section 151 of the first actuator section 11, the third piezoelectric conversion section 251 of the second actuator section 22, the fifth piezoelectric conversion section 351 of the third actuator section 31, the seventh piezoelectric conversion section 451 of the fourth actuator section 42, an upper electrode driving scheme is employed in which the lower electrode sections (141, 241, 341, and 441) are connected to the ground potential, and the drive voltage $V_1$ is applied to the upper electrode sections (111, 221, 311, and 421) to perform piezoelectric driving.

On the other hand, in the second piezoelectric conversion section 152 of the first actuator section 11, the fourth piezoelectric conversion section 252 of the second actuator section 22, the sixth piezoelectric conversion section 352 of the third actuator section 31, and the eighth piezoelectric conversion section 452 of the fourth actuator section 42, a lower electrode driving scheme is employed in which the upper electrode sections (112, 222, 312, and 422) are set at the ground potential, and the drive voltage $V_2$ having the same phase as the drive voltage $V_1$ is applied to the lower electrode section (142, 242, 342, and 442) to perform the driving.

As described above, all of the piezoelectric conversion sections (151, 152, 251, 252, 351, 352, 451, and 452) are used as the driving force generation sections, so that a large displacement angle can be obtained.

It is noted that the representation of "same phase" includes an allowable range of a phase difference (for example,)±10° in which the phases can be employed as substantially the same phase, which is not problematic in practice, regardless of a phase difference 0°.

In the plurality of piezoelectric element sections (piezoelectric conversion sections) that function as the driving force generation sections, the voltage amplitude and phase difference of drive voltage that is applied to each of the piezoelectric element sections may be adjusted as appropriate in order to adjust operation performance between elements. The embodiment of the presently disclosed subject matter includes a case in which voltage amplitude and a phase difference are changed within the range of such adjustment.

(Utility Example 2)

Figure 8:
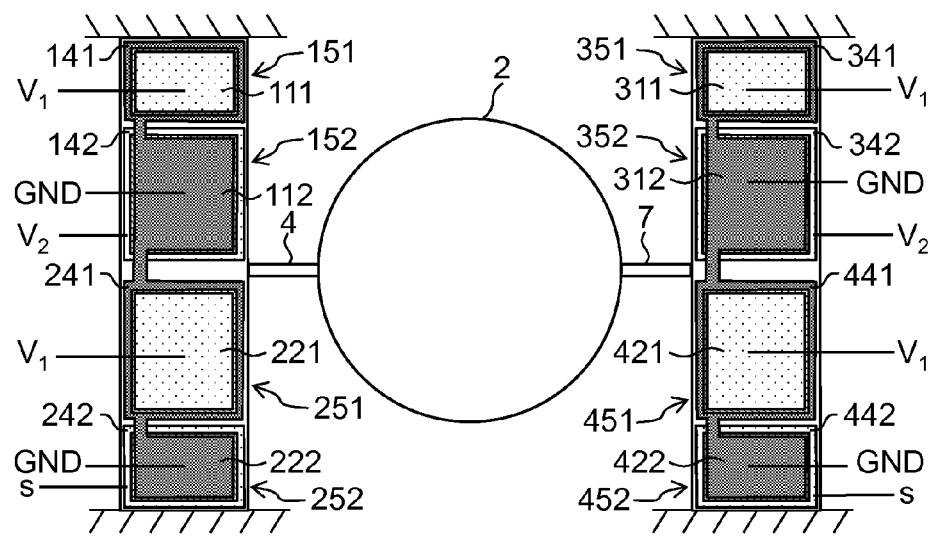
FIG. 8 is a diagram illustrating a configuration in which a part of electrode sections is used for sensing (detection) in the device structure of FIG. 1.

FIG. 8 is a diagram illustrating an example of a part the first piezoelectric conversion section 151 to the eighth piezoelectric conversion section 452 is used as a sensing (detection) electrode for stress detection. Here, an example is described in which the fourth piezoelectric conversion section 252 and the eighth piezoelectric conversion section 452 are used as sensor sections, and the fourth lower electrode section 242 and the eighth lower electrode section 442 are used as detection electrodes, the other piezoelectric conversion sections are used as driving force generation sections.

The detection electrode is set at a floating potential and detects voltage that is generated by a piezoelectric effect of the piezoelectric body 66 (positive piezoelectric effect). In FIG. 8, electrodes represented by "s" (reference numerals 242 and 422) are detection electrodes that are used to detect a sensing signal and are set at a floating potential.

As described above, when a part of the plurality of electrodes sections is used as a voltage detection section, voltage that is generated by the positive voltage effect of the piezoelectric body can be detected, and a stress of the actuator section can be detected from the detected voltage signal (detection signal). That is, the voltage detection section functions as a stress detection section. As a result, a drive circuit that enables keeping of the resonant state, etc. can be configured.

It is noted that, instead of the structure in FIG. 8, or by combing with the structure in FIG. 8, the first piezoelectric conversion section 151 and the fifth piezoelectric conversion section 351 can be used as sensor sections, and the first upper electrode section 111 and the fifth upper electrode section 311 can be used as detection electrodes.

(Utility Example 3)

Figure 9:
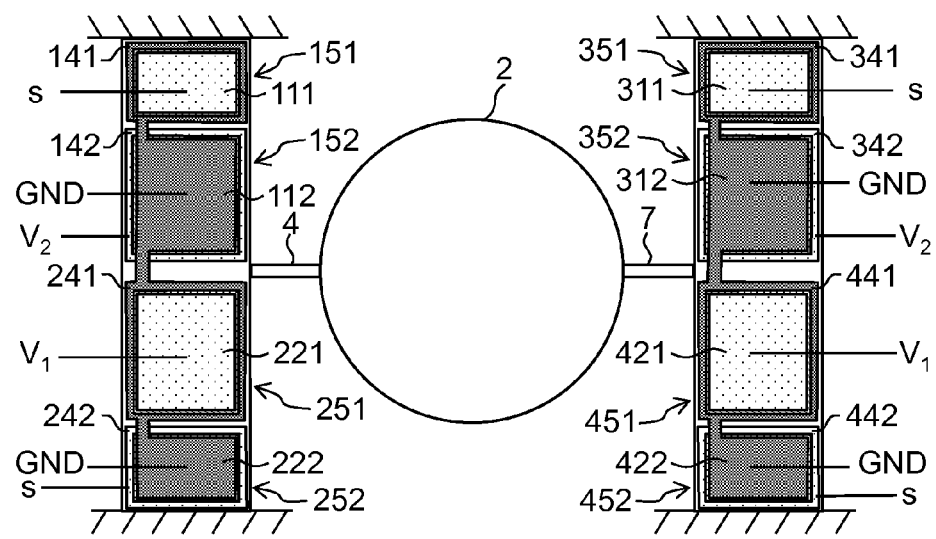
FIG. 9 is a diagram illustrating another configuration in which a part of the electrode sections is used for sensing in the device structure of FIG. 1.

FIG. 9 is a diagram illustrating an example of a configuration in which at least one voltage detection section (stress detection section) is provided in each of the actuator sections (11, 22, 31, and 42) that constitutes the piezoelectric actuator section. Here, the first upper electrode section 111, the fourth lower electrode section 242, the fifth upper electrode section 311, and the eighth lower electrode section 442 function as sensing electrodes.

As described above, by providing the voltage detection section for each of the actuator sections, the operation state can be grasped for each of the actuator sections, so that application control of drive voltage can be performed appropriately based on a detection signal, and further stable resonance driving can be achieved.

(Utility Example 4)

Figure 10:
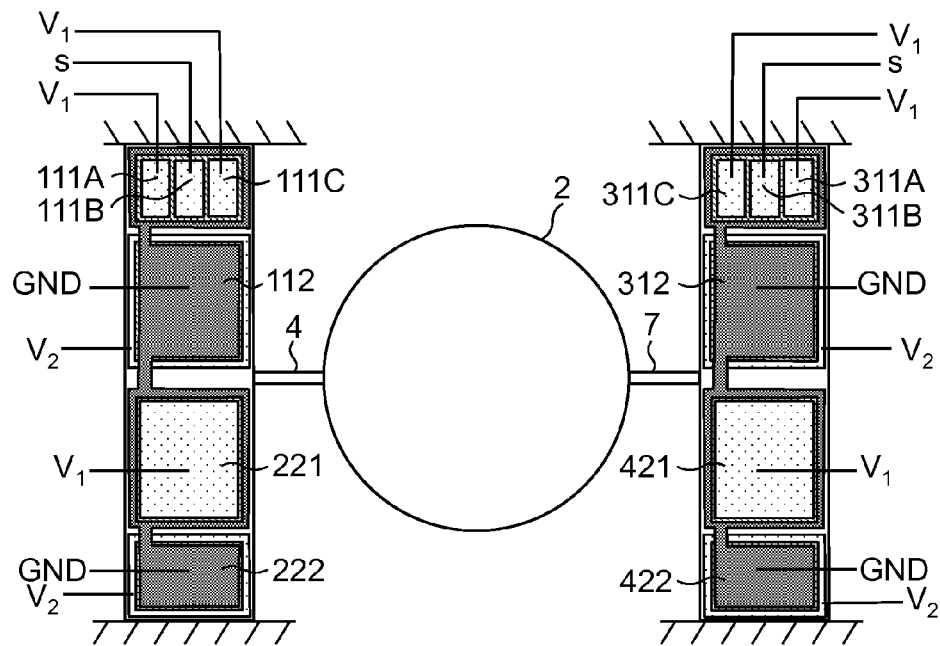
FIG. 10 is a diagram illustrating a configuration in which a part of a plurality of electrodes that constitutes the electrode section is used for sensing.

FIG. 10 is a modification of FIG. 8. FIG. 10 is a diagram illustrating an example in which each of the first upper electrode section 111 and the fifth upper electrode section 311 that are used for sensing is further divided into a plurality of electrodes. In FIG. 10, an example is illustrated in which the first upper electrode section 111 is divided into three electrodes 111A, 111B, and 111C in the x direction, and the fifth upper electrode section 311 is divided into three electrodes 311A, 311B, and 311C in the x direction.

From among the plurality of electrodes 111A to 111C that constitutes the first upper electrode section 111, the electrode 111B that is arranged in the center is set at a floating potential and used as a voltage detection section (sensing electrode), and the remaining electrodes 111A and 111C that are arranged on the left and right sides of the electrode 111B are used as drive voltage application sections (that is, driving force generation sections).

Similarly, from among the plurality of electrodes 311A to 311C that constitutes the fifth upper electrode section 311, the electrode 311B that is arranged at the center is set at a floating potential, and used as a voltage detection section (sensing electrode), and the remaining electrodes 311A and 311C that are arranged on the left and right sides of the electrode 311B are used as drive voltage application sections (that is, driving force generation sections).

As a result, an electrode area that is used for the voltage detection section is minimized, and a high scan angle is kept, and stress detection can be performed.

(Utility Example 5)

Figure 11:
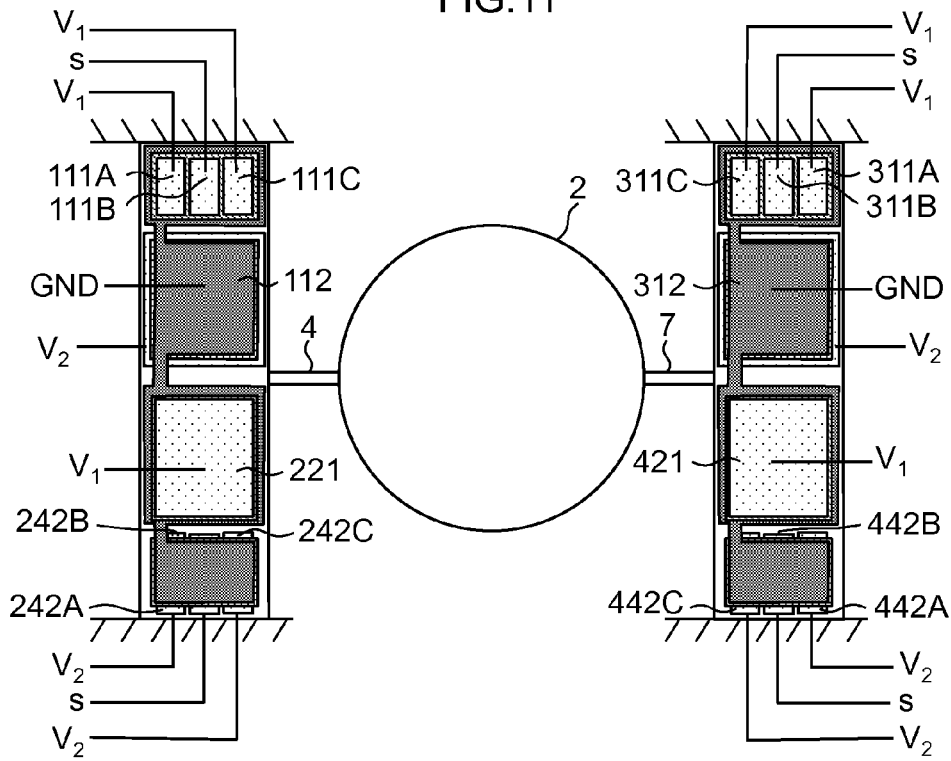
FIG. 11 is a diagram illustrating another configuration in which a part of the plurality of electrodes that constitutes the electrode section is used for sensing.

FIG. 11 is a modification of FIG. 9. In FIG. 11, an example is described in which each of the first upper electrode section 111, the fourth lower electrode section 242, the fifth upper electrode section 311, and the eighth lower electrode section 442 illustrated in FIG. 9 is further divided into a plurality of electrodes. In FIG. 11, the same reference numerals is assigned to an element that is similar to that of the structure described in FIG. 10, and the description is omitted herein.

In FIG. 11, an example is illustrated in which the fourth lower electrode section 242 is further divided into three electrodes 242A, 242B, and 242C in the x direction, and the eighth lower electrode section 442 is further divided into three electrodes 442A, 442B, and 442C in the x direction as compared with the configuration in FIG. 10.

From among the plurality of electrodes 242A to 242C that constitutes the fourth lower electrode section 242, the electrode 242B that is arranged at the center is set at a floating potential and used as a voltage detection section (sensing electrode), and the remaining electrodes 242A and 242C that are arranged on the left and right sides of the electrode 242B are used as drive voltage application sections (that is, driving force generation sections).

Similarly, from among the plurality of electrodes 442A to 442C that constitutes the eighth lower electrode section 442, the electrode 442B that is arranged at the center is set as a floating potential and used as a voltage detection section (sensing electrode), and the remaining electrodes 442A and 442C that are arranged on the left and right sides of the electrode 442B are used as drive voltage application sections (that is, driving force generation sections).

As a result, an electrode area that is used for the voltage detection section is minimized, and a high scan angle is kept, and the stress detection can be performed.

<Manufacturing Method in the First Embodiment>

A micro scanner device is manufactured by a manufacturing method that is described below as the first embodiment.

(Procedure 1)

A Ti layer is formed by 30 nm, and a Ir layer is formed by 150 nm on a Silicon On Insulator (SOI) substrate having a lamination structure in which a handle layer 350 μm, a box layer 1 μm, and a device layer 24 μm are laminated by a sputtering method at substrate temperature 350° C. A conductive layer by the lamination body of the Ti layer (30 nm) and the Ir layer (150 nm) corresponds to "the lower electrode 64" described in FIG. 2.

(Procedure 2)

Film-forming of the piezoelectric body (PZT) layer by 2.5 μm is performed on the substrate that is formed so as to laminated with the lower electrode (Ti/Ir) in the procedure 1, using a high frequency (radio frequency: RF) sputtering device.

As film-forming gas, a mixture gas of 97.5% Ar and 2.5% $O_2$ is used, and as a target material, the composition of $Pb_{1.3}$ $((Zr_{0.52} T_{0.48})_{0.88} Nb_{0.12}) O_3$ is used. Film-forming pressure is 2.2 mTorr (about 0.293 Pa), and film-forming temperature is 450° C. The obtained PZT layer is a Nb dope PZT thin film to which 12% of Nb is doped in the atomic composition ratio.

A composition ratio of Pb contained in the formed PZT thin film was measured by the X-ray Fluorescence Analysis (XRF). A measured ratio of Pb/(Zr+Ti+Nb) was 1.05. Thus, the chemical formula of the formed PZT thin film was $Pb_a$ $(Zr_x, Ti_y, Nb_{b-x-y})_b O_c$ (b=1, a=1.05). As described above, a ratio "a" of a Pb amount contained in the formed PZT thin film having a perovskite structure may be unequal to 1.00, due to an interstitial atom or lattice defect. A ratio "c" of O atoms contained in the formed PZT thin film having a perovskite structure may be unequal to 3.00, due to an interstitial atom or lattice defect.

(Procedure 3)

Pattern forming of an upper electrode having a lamination structure of Pt/Ti by a liftoff method is performed on the substrate on which the PZT layer is formed by the procedure 2, and pattern etching of the PZT thin film is performed by inductively coupled plasma (ICP) dry etching.

(Procedure 4)

After that, pattern etching is performed on a device layer by a dry etch process of silicon, and the shapes of the actuator section, the mirror section, and the fixture member are processed.

(Procedure 5)

After that, deep etching (Deep RIE: Reactive Ion Etching) of a handle layer is performed on the back surface of the substrate.

(Procedure 6)

At last, by removing the box layer from the back surface by dry etching, a micro scanner device having the structure as illustrated in FIG. 1 is manufactured.

In the embodiment, the film-forming of a PZT thin film is performed directly on a substrate by the sputtering method, and then the dry etching process is performed so as to form the PZT thin film. As described above, the piezoelectric body is thinned to simplify the manufacturing process, and fine patterning can be performed. This improves yield significantly, and the further downsizing of the device can be achieved.

However, in the embodiment of the presently disclosed subject matter, the piezoelectric body of the actuator section is not limited to the thin film piezoelectric body, and the unimorph actuator may be formed by attaching a bulk piezoelectric body to a diaphragm.

<Comparative Example 1>

Figure 12:
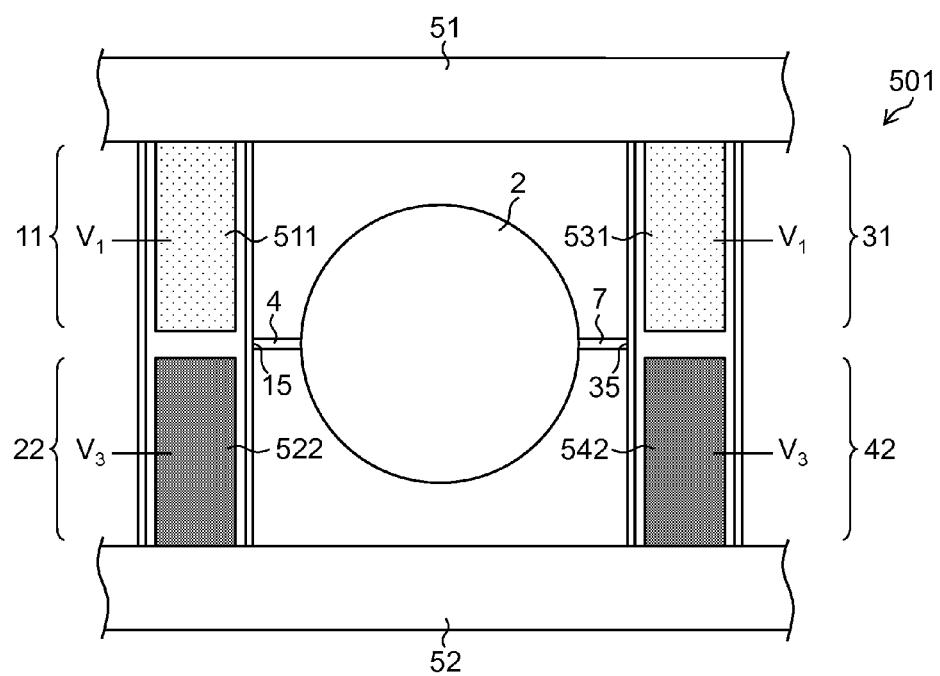
FIG. 12 is a plan view illustrating a structure of a micro scanner device according to a comparative example 1.

By using the substrate (SOI substrate) and the manufacturing process method that are completely the same as the first embodiment, a micro scanner device according to a comparative example 1 illustrated in FIG. 12 is manufactured.

In a device 501 illustrated in FIG. 12, the same reference numeral is assigned to an element that is the same as or similar to the structure of FIG. 1, and the description is omitted herein.

In the structure of the device 501 according to the comparative example 1, the upper electrodes of the first actuator section 11, the second actuator section 22, the third actuator section 31, and the fourth actuator section 42 respectively include only single electrode sections 511, 522, 531, and 542. In addition, the lower electrode is not divided, and has a single (solid) shared electrode.

FIG. 12 is a diagram illustrating an example in which all of the upper electrode sections (511, 522, 531, and 542) are used as driving electrodes. The drive voltage $V_1$ is applied to the electrode section 511 of the first actuator section 11 and the electrode section 531 of the third actuator section 31, and the drive voltage $V_3$ having an opposite phase to the drive voltage $V_1$ is applied to the electrode section 522 of the second actuator section 22 and the electrode section 542 of the fourth actuator section 42.

As the voltage waveform of the drive voltage $V_3$, for example, the following waveform can be used.

$$V_3 = V_{off3} + V_{3A} \sin(\omega t + \varphi)$$

In the above-described formula, "$V_{off3}$" is offset voltage, and "$V_{3A}$" is voltage amplitude, and "$\varphi$" is a phase difference, and here, "$\varphi=180°$" is satisfied.

Here, "$V_{3A}$" is a given value of 0 or more, and also can be the same value as the above-described drive voltages $V_1$ and $V_2$ ($V_{3A}=V_{2A}=V_{1A}$). The offset voltage $V_{off3}$ is optional, and for example, it is preferable that the drive voltage "$V_3$" is set so as not to exceed polarization reversal voltage of the piezoelectric body. In the device evaluation experiment that is describe later, the offset voltage $V_{off3}$ in the drive voltage $V_3$, and the offset voltages $V_{off1}$, and $V_{off2}$ in the drive voltages $V_1$ and $V_2$ are the same voltage value $V_{off}$ ($=V_{off1}=V_{off2}=V_{off3}$).

In the configuration of FIG. 12 as described above, by applying the drive voltages $V_1$ and $V_3$ that have the opposite phases, bending deformation occurs in the first actuator section 11 and the second actuator section 22 by the inverse piezoelectric effect of the piezoelectric body 66.

When the stress detection is performed in the device configuration as illustrated in FIG. 12, one of the plurality of upper electrode sections (511, 522, 531, and 542) is used as a detection (sensing) electrode.

One of the first actuator section 11 and the second actuator section 22 that are connected to the first torsion bar section 4 is caused to function as a sensing electrode. Similarly, one of the third actuator section 31 and the fourth actuator section 42 that are connected to the second torsion bar section 7 is caused to function as a sensing electrode.

Figure 13:
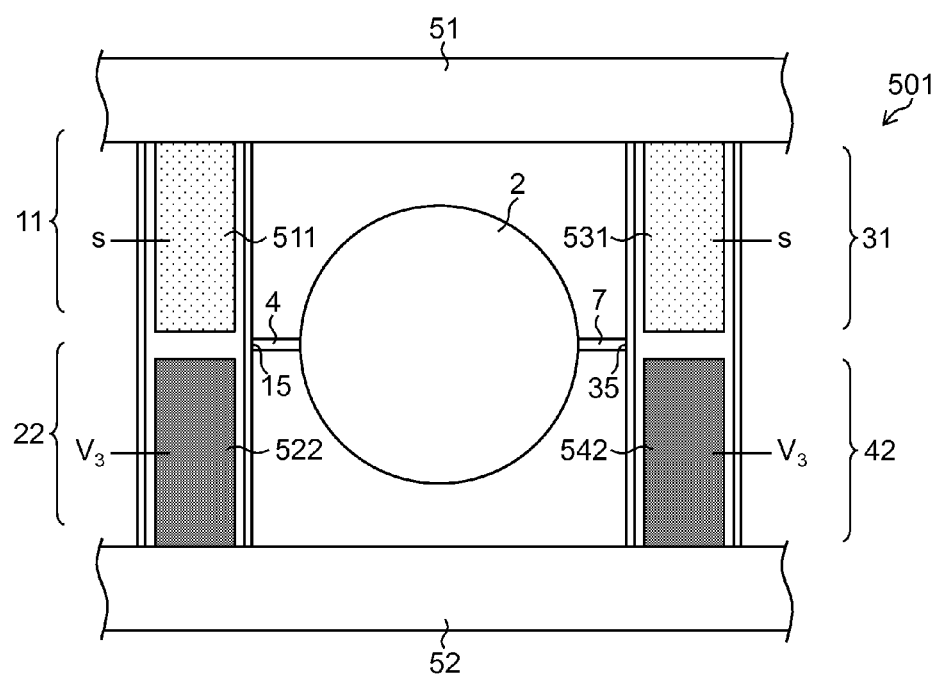
FIG. 13 is a diagram illustrating a configuration in which sensing is performed in the device structure of FIG. 12.

In FIG. 13, an example is illustrated in which the electrode sections 511 and 531 are used as sensing electrodes in view of the symmetry. The electrode section that is used for sensing is set at a floating potential and detects voltage that is generated by the positive piezoelectric effect of the piezoelectric body.

<Operation Evaluation Experiment of the Device>

Figure 14:
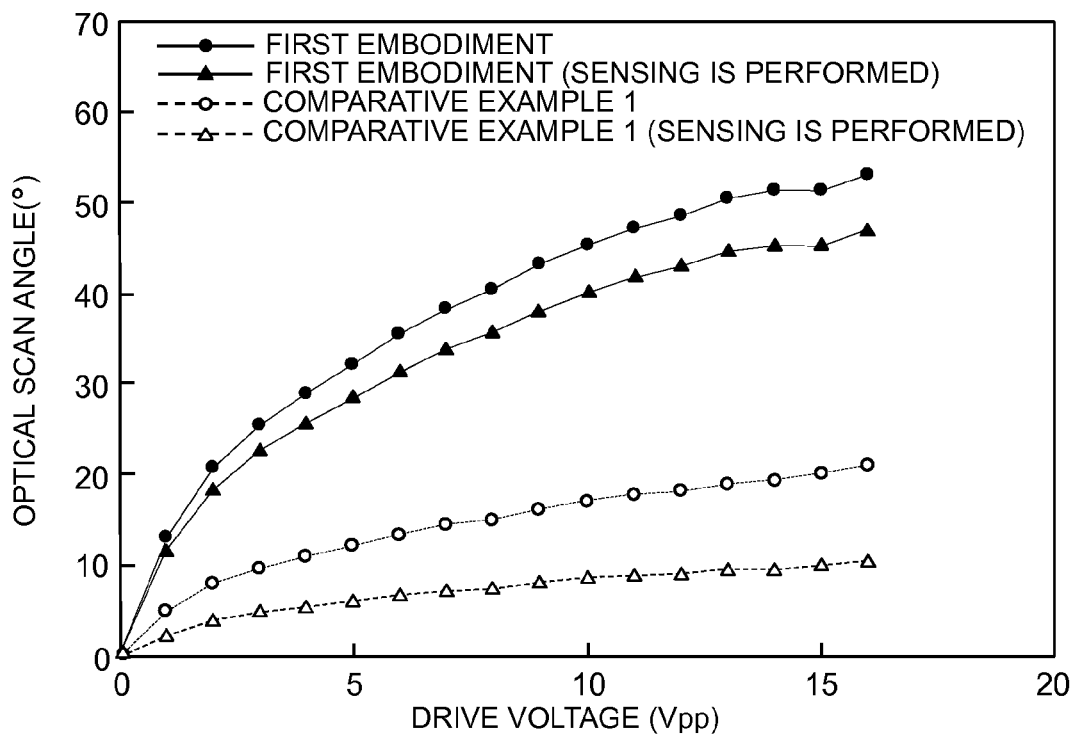
FIG. 14 is a graph illustrating a relationship between applied voltage and an optical scan angle for the first embodiment and the comparative example 1.

An experiment is conducted in which the operation performance of the device that is manufactured in the first embodiment and the operation performance the device that is manufactured in the comparative example 1 are compared with each other. FIG. 14 is a graph illustrating a relationship between drive voltage and a scan angle in a device that is an experiment target.

As an experiment target, four types of devices according to "first embodiment", "first embodiment (sensing is performed)", "comparative example 1", and "comparative example 1 (sensing is performed)" are evaluated. Here, "first embodiment" corresponds to the configuration in FIG. 7, and "first embodiment (sensing is performed)" corresponds to the configuration in FIG. 8, and "comparative example 1" corresponds to the configuration in FIG. 12, and "comparative example 1 (sensing is performed)" corresponds to the configuration in FIG. 13.

In each of the device, the drive voltages $V_1$, $V_2$, and $V_3$ by the sine wave of voltage amplitude $V_{PP}$ are input to the drive electrode section, resonant vibration that is associated with the rotation movement of the mirror section 2 (oscillating movement in which rotation around the rotating axis $R_A$ is performed) is induced, and a machine deflection angle of the mirror section 2 is measured by a scan angle of laser. In the application method of drive voltage, the devices according to "first embodiment" and "first embodiment (sensing is performed)" are applied correspondingly to the descriptions in FIGS. 7 and 8. The devices according to "comparative example 1" and "comparative example 1 (sensing is performed)" are applied correspondingly to the descriptions in FIGS. 12 and 13. In the first embodiment and the comparative example 1, the resonant frequency is 25 kHz.

The result of the experiment is illustrated in FIG. 14. In FIG. 14, the horizontal axis indicates voltage amplitude (unit of volts [V]), and the vertical axis indicates an optical scan angle (unit of degrees [deg]).

As can be seen from FIG. 14, the device according to the first embodiment in which a single actuator section includes a plurality of electrodes section can obtain a high scan angle as compared with the device according to the comparative example 1. In addition, even when the stress detection section that is obtained by using a part of electrode sections for sensing is provided, it is confirmed that, in the device according to the first embodiment (sensing is performed in the first embodiment), a high scan angle can be kept as compared with the device according to the comparative example 1.

<Piezoelectric Material>

As the piezoelectric body that is suitable for the embodiment, there is one or more kinds of perovskite-type oxides (P) that are represented by the following formula.

$$\text{General formula } ABO_3 \tag{P}$$

In the formula, "A" is an element of A-site, and at least one element including Pb.

"B" is an element of B-site, and at least one element that is selected from a group including Ti, Zr, V, Nb, Ta, Sb, Cr, Mo, W, Mn, Sc, Co, Cu, In, Sn, Ga, Zn, Cd, Fe, and Ni.

"O" is oxygen element.

The standard molar ratio of the A-site element, the B-site element, and the oxygen element is 1:1:3, and the molar ratio may be deviated from the standard molar ratio within a range in which the perovskite structure can be obtained.

As the perovskite-type oxide that is represented by the above-described general formula (P), there are a lead-containing compound such as lead titanate, lead zirconate titanate (PZT), lead zirconate, lead lanthanum titanate, lead lanthanum zirconate titanate, magnesium niobate lead zirconium titanate, nickel niobate zirconium lead titanate, zinc niobate zirconium lead titanate, and mixed crystal systems of the compounds, and a non-lead-containing compound such as barium titanate, strontium barium titanate, bismuth sodium titanate, bismuth potassium titanate, sodium niobate, potassium niobate, lithium niobate, bismuth ferrite, and mixed crystal systems of the compounds.

In addition, it is preferable that the piezoelectric body film according to the embodiment includes one or more kinds of perovskite-type oxides (PX) that are represented by the following formula.

$$\text{General formula } A_a(Zr_x,Ti_y,M_{b-x-y})_bO_c \tag{PX}$$

In the formula, "A" is an element of A-site, and at least one element including Pb.

"M" is at least one element that is selected from a group including V, Nb, Ta, and Sb.

"$0<x<b$", "$0<y<b$", and "$0\leq b-x-y$" are satisfied.

The standard molar ratio is "$a:b:c=1:1:3$", but the molar ratio may be deviated from the standard molar ratio within a range in which the perovskite structure can be obtained.

The perovskite-type oxide (PX) is a genuine PZT, or an oxide that is obtained by replacing a part of B-site of the PZT with M. In a PZT that is doped with various donor ions having a valence that is higher than the valence of a replacement ion, it is known that a characteristic of the piezoelectric performance, etc. is improved as compared with the genuine PZT. It is preferable that "M" is one or more types of donor ions the valence of which is larger than that of tetravalent Zr and Ti. As such a donor ion, there are $V^{5+}$, $Nb^{5+}$, $Ta^{5+}$, $Sb^{5+}$, $Mo^{6+}$, $W^{6+}$, etc.

The b-x-y is not particularly limited as long as the range is a range in which the perovskite structure can be obtained. For example, when "M" is Nb, it is preferable that the Nb/(Zr+Ti+Nb) molar ratio is 0.05 or more to 0.25 or less, and it is further preferable that the molar ratio is 0.06 or more to 0.20 or less.

The piezoelectric body film that is constituted by the perovskite-type oxide that is represented by the above-described general formulas (P) and (PX) has a high piezoelectric distortion constant (d31 constant), so that a piezoelectric actuator that includes such a piezoelectric body film has an excellent displacement characteristic.

In addition, the piezoelectric actuator that includes the piezoelectric body film that is constituted by the perovskite-type oxide that is represented by the general formula (P) and (PX) has a voltage-displacement characteristic of excellent linearity. The piezoelectric material has an actuator characteristic and a sensor characteristic that are excellent for the embodiments of the presently disclosed subject matter. It is noted that the perovskite-type oxide that is represented by the general formula (PX) has a higher piezoelectric constant than the perovskite-type oxide that is represented by the general formula (P).

As a certain specific example of the piezoelectric body according to the embodiment, for example, a lead zirconate titanate (PZT) thin film that is doped with Nb by 12% in atomic composition percentage can be used. By performing film-forming of the PZT that is doped with Nb by 12% using the sputtering method, etc., a thin film having a high piezoelectric characteristic of "piezoelectric constant d31=250 pm/V" can be manufactured stably.

It is noted that in the embodiment, the PZT is selected as the piezoelectric body material that is used for the actuator section (driving force generation section and stress detection section), but the embodiment is not limited to such a material. For example, a lead-free piezoelectric body of $BaTiO_3$, $KNaNbO_3$, $BiFeO_3$, etc. can be used, and a non-perovskite piezoelectric body of AlN, $ZnO_2$, etc. can be also used.

<Film-forming Method>

As a film-forming method of the piezoelectric body, a vapor-phase growth method is preferable. For example, instead of the sputtering method, various methods such as an ion plating method, a metal organic chemical vapor deposition method (MOCVD), a pulse laser deposition (PLD) method can be applied. In addition, it is conceivable that a method other than the vapor-phase growth method (for example, sol-gel method, etc.) is used. It is preferable that film-forming of a piezoelectric thin film is directly performed on a substrate by the vapor-phase growth method, the sol-gel method, etc. In particular, as the piezoelectric body 66 according to the embodiment, it is preferable that a thin film has a film thickness of 1 μm or more to 10 μm or less.

<Second Embodiment>

Figure 15:
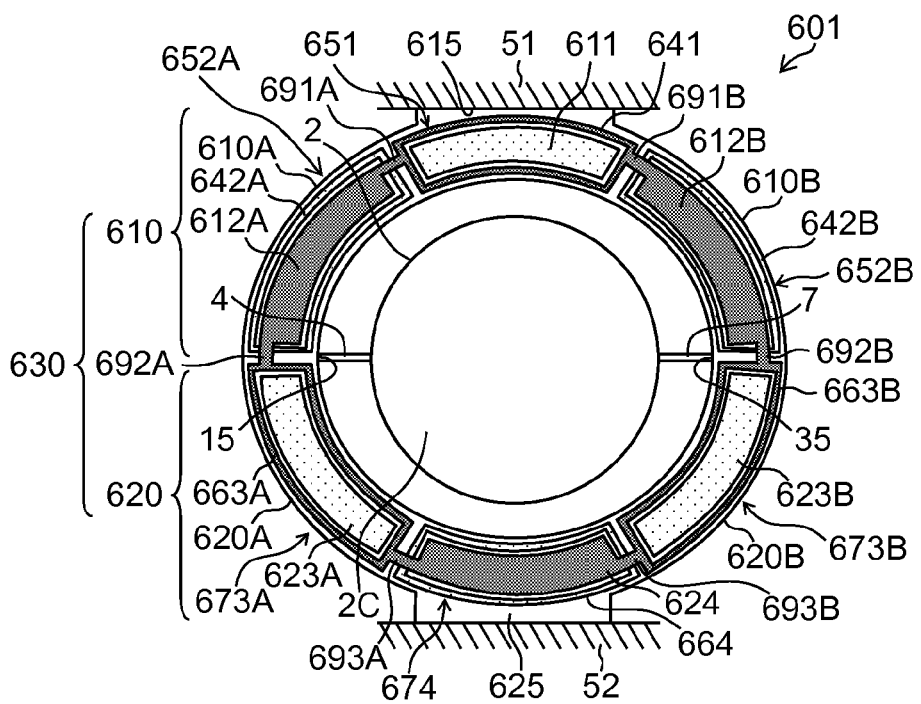
FIG. 15 is a plan view illustrating a structure of a micro scanner device according to a second embodiment.

A micro scanner device 601 illustrated in FIG. 15 is manufactured using completely the same substrate (SOI substrate) as the first embodiment by the same process method. In FIG. 15, the same reference numeral is assigned to an element that is the same as or similar to the device 1 illustrated in FIG. 1, and the description is omitted herein.

The micro scanner device 601 according to the second embodiment is constituted by a first actuator section 610 and a second actuator section 620 that are unimorph actuators having a tuning-fork shape, and the micro scanner device 601 has an approximately annular actuator shape in a plan view by the structure in which the first actuator section 610 and the second actuator section 620 are coupled to each other. In the example of FIG. 15, an oval annular appearance (contour) shape that is slightly flattened from a perfect circle is illustrated, but the annular actuator shape is not limited to the illustrated example. An annular shape of a perfect circle may be employed, and an oval annular shape the aspect ratio of which is further larger than the example of FIG. 15 may be employed. However, large torque can be obtained by a large area of the actuator section, so that the oval shape is preferable as compared with the perfect circle.

From among the two coupling sections 15 and 35 between the first actuator section 610 and the second actuator section 620 that have tuning-fork shapes, the first torsion bar section 4 is connected to the coupling section 15, and the second torsion bar section 7 is connected to the coupling section 35.

The first actuator section 610 has a tuning-fork shape in which two arm sections 610A and 610B are arranged so as to be divided on both sides of the x direction of the mirror section 2. A base end section 615 that corresponds to a root portion that bifurcates toward the two arm sections 610A and 610B is fixed to the first fixture member 51. The first actuator section 610 operates as tuning-fork type piezoelectric actuator that uses the base end section 615 that is fixed to the first fixture member 51 as a fixture end.

As illustrated in FIG. 15, the upper electrode of the first actuator section 610 is divided into a single first upper electrode section 611 and two second upper electrode sections 612A and 612B for the longitudinal direction along the shapes of the arm sections 610A and 610B.

In addition, the lower electrode of the first actuator section 610 is divided into a single first lower electrode section 641 and two second lower electrode sections 642A and 642B for the longitudinal direction along the shapes of the arm sections 610A and 610B.

The first upper electrode section 611 and the first lower electrode section 641 have a position relationship so as to be opposite to each other across the piezoelectric body 66. A first piezoelectric conversion section 651 is constituted by a lamination structure in which the piezoelectric body 66 lies between the first upper electrode section 611 and the first lower electrode section 641. In the first piezoelectric conversion section 651, a pair of the first upper electrode section 611 and the first lower electrode section 641 functions as an electrode pair.

Similarly, the second upper electrode sections 612A and 612B have position relationships so as to be respectively opposite to the second lower electrode sections 642A and 642B across the piezoelectric body 66. A second piezoelectric conversion section 652A is constituted by a lamination structure in which the piezoelectric body 66 lies between the second upper electrode section 612A and the second lower electrode section 642A that are provided in the arm section 610A on the left side of FIG. 15. In the second piezoelectric conversion section 652A, a pair of the second upper electrode section 612A and the second lower electrode section 642A functions as an electrode pair. In addition, a second piezoelectric conversion section 652B is constituted by a lamination structure in which the piezoelectric body 66 lies between the second upper electrode section 612B and the second lower electrode section 642B that are provided in the arm section 610B on the right side of FIG. 15. In the second piezoelectric conversion section 652B, a pair of the second upper electrode section 612B and the second lower electrode section 642B functions as an electrode pair.

The structure of the second actuator section 620 is similar to the structure of the first actuator section 610. The second actuator section 620 has a tuning-fork shape in which two arm sections 620A and 620B are arranged so as to be divided on both sides of the x direction of the mirror section 2. A base end section 625 that corresponds to a root portion that bifurcates toward the two arm sections 620A and 620B is fixed to the second fixture member 52, and operates as a tuning-fork type piezoelectric actuator that uses the base end section 625 as a fixture end.

As illustrated in FIG. 15, the upper electrode of the second actuator section 620 is divided into two third upper electrode sections 623A and 623B, and a single fourth upper electrode section 624 along the shapes of the arm sections 620A and 620B.

In addition, the lower electrode of the second actuator section 620 is divided into two third lower electrode sections 663A and 663B, and a single fourth lower electrode section 664 for the longitudinal direction of the shapes of the arm sections 620A and 620B.

The third upper electrode sections 623A and 623B have positional relationships so as to be respectively opposite to the third lower electrode sections 663A and 663B across the piezoelectric body 66. A third piezoelectric conversion section 673A is constituted by a lamination structure in which the piezoelectric body 66 lies between the third upper electrode section 623A and the third lower electrode section 663A that are provided in an arm section 620A on the left side of FIG. 15. In the second piezoelectric conversion section 652A, a pair of the second upper electrode section 612A and the second lower electrode section 642A functions as an electrode pair. In addition, the second piezoelectric conversion section 652B is constituted by a lamination structure in which the piezoelectric body 66 lies between the second upper electrode section 612B and the second lower electrode section 642B that are provided in the arm section 610B on the right side of FIG. 15. In the second piezoelectric conversion section 652B, a pair of the second upper electrode section 612B and the second lower electrode section 642B functions as an electrode pair.

The fourth upper electrode section 624 and the fourth lower electrode section 664 are opposite to each other across the piezoelectric body 66, and a fourth piezoelectric conversion section 674 is constituted by a lamination structure in which the piezoelectric body 66 lies between the fourth upper electrode section 624 and the fourth lower electrode section 664. In the fourth piezoelectric conversion section 674, a pair of the fourth upper electrode section 624 and the fourth lower electrode section 664 functions as an electrode pair.

In the example of FIG. 15, it is assumed that all of the first lower electrode section 641, the second upper electrode sections 612A and 612B, the third lower electrode sections 663A and 663B, and the fourth upper electrode section 624 are set as a ground potential (GND), so that the electrode sections (641, 612A, 612B, 663A, 663B, and 664) are connected to each other through wiring sections 691A, 691B, 692A, 692B, 693A, and 693B. In this case, an insulator layer is inserted between the wiring section and the lower electrode so that electricity is not conducted between the wiring sections and the lower electrodes 642A, 642B, 664, etc. As a material of the insulator layer, for example, a SiO$_2$ film that is manufactured by a sputtering method, a chemical vapor deposition (CVD) method, etc., a polyimide-based thin film, an epoxy-based thin film, etc. that are manufactured by a spin coating method can be used.

A piezoelectric actuator section 630 is configured that has an annular structure in which the arm sections 610A and 610B of the first actuator section 610 are respectively connected to the arm sections 620A and 620B of the second actuator section 620 through the coupling sections 15 and 35.

Figure 16:
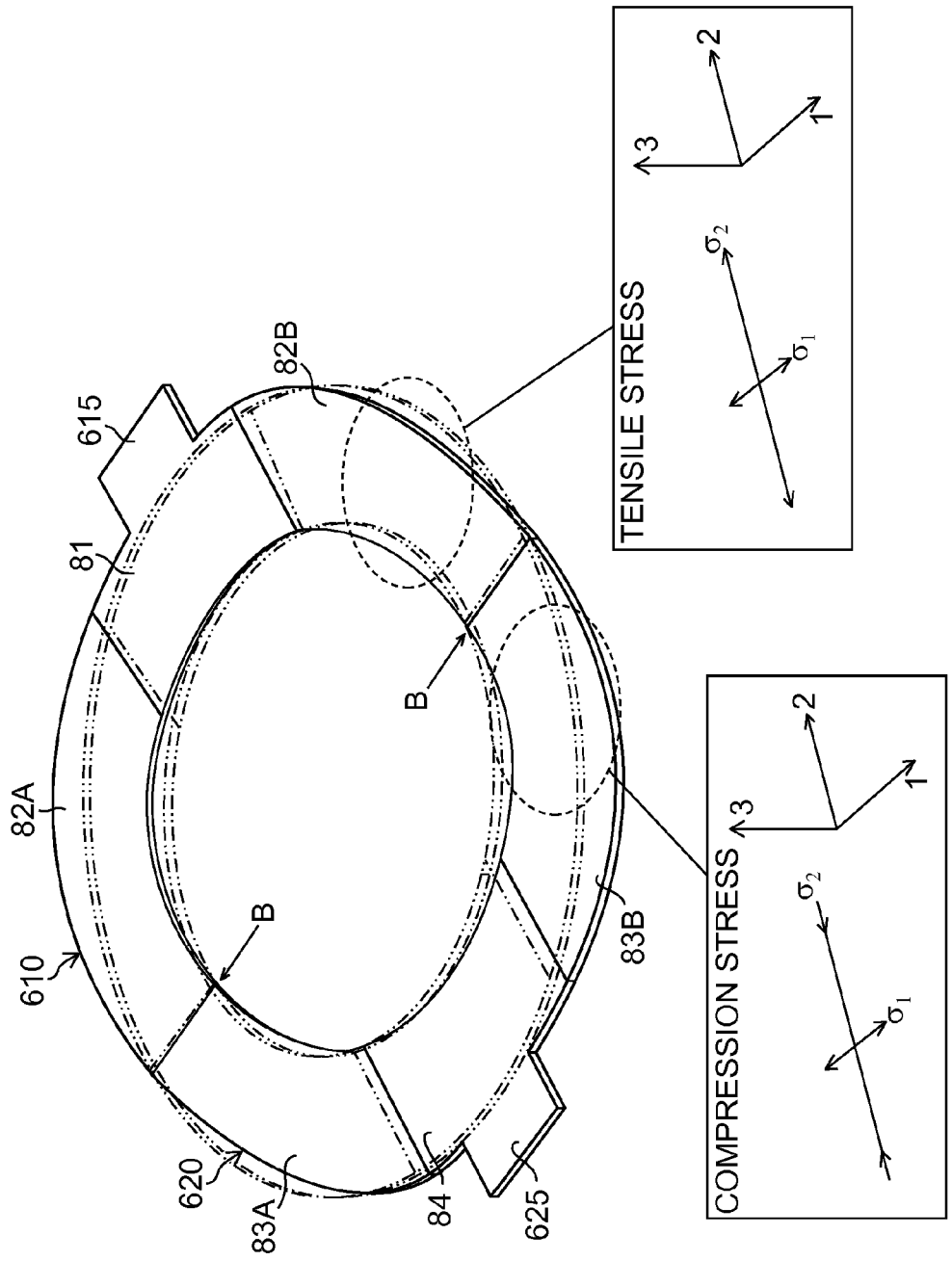
FIG. 16 is a schematic diagram illustrating displacement of a piezoelectric body and stress distribution of principal stresses at the time of resonance driving in the device structure of FIG. 15.

FIG. 16 is a schematic perspective view illustrating deformation of the piezoelectric actuator section and distribution of stress directions of principal stresses at the time of resonant mode driving of the micro scanner. In FIG. 16, the mirror section 2, the first torsion bar section 4, and the second torsion bar section 7 illustrated in FIG. 15 are omitted. In FIG. 16, portions that are indicated by arrows B are portions that correspond to the coupling sections 15 and 35.

At the time of resonance driving, the piezoelectric actuator section 630 is deformed as illustrated in FIG. 16, and tilting displacement occurs in the portions that are indicated by the arrows B. As a result, tilting displacement of the first torsion bar section 4, the second torsion bar section 7 and the mirror section 2 illustrated in FIG. 15 is induced.

At that time, in the piezoelectric body section inside the first actuator section 610 and the second actuator section 620, there exist both a portion in which a stress in the compression direction occurs and a portion in which a stress in the tensile direction occurs. In FIG. 16, the compression stress occurs in portions of areas illustrated by reference numerals 81, 83A, and 83B, and the tensile stress occurs in portions of areas illustrated by reference numerals 82A, 82B, and 84. It is noted that, in FIG. 16, there exist an intermediate area in which the stress direction is transiently changed in a boundary portion of the areas, but the illustration is omitted herein.

Correspondingly the stress distribution as illustrated in FIG. 16, the first upper electrode section 611, the second upper electrode sections 612A and 612B, the third upper electrode sections 623A and 623B, and the fourth upper electrode section 624 are respectively arranged for the areas of the piezoelectric body section having different stress directions (reference numerals 81, 82A, 82B, 83A, 83B, and 84).

Similarly, in the lower electrode, correspondingly the stress distribution as illustrated in FIG. 16, the first lower electrode section 641, the second lower electrode sections 642A and 642B, the third lower electrode sections 663A and 663B, and the fourth lower electrode section 664 are respectively arranged for the areas of the piezoelectric body section having different stress directions (reference numerals 81, 82A, 82B, 83A, 83B, and 84).

When a group (electrode group) is constituted by piezoelectric conversion sections that correspond to the areas having the same stress direction, and the piezoelectric conversion sections are segmented into two groups so as to correspond to areas in which stresses occurs in opposite directions to each other, the first piezoelectric conversion section 651, and the third piezoelectric conversion sections 673A and 673B belong to a first group (first electrode group), and the second piezoelectric conversion sections 652A and 652B, and the fourth piezoelectric conversion section 674 belong to a second group (second electrode group).

By arranging the electrode section that belongs to the first group and the electrode section that belongs to the second group in piezoelectric body sections having different stress directions (having stresses in the opposite directions to each other) as described above, piezoelectric power can converted into tilting displacement the most efficiently.

Here, "compression stress" and "tensile stress" are defined by selecting two principal stresses in the plane that is orthogonal to the film thickness direction of the piezoelectric body, from three principal stress vector that are orthogonal to each other ($\sigma_1$ and $\sigma_2$ in FIG. 16), and selecting a direction having a larger absolute value (direction of the maximum principal stress) from the selected two principal stresses. The direction is the direction of $\sigma_2$ in FIG. 16. Here, a vector in a direction toward the outside is defined as the tensile direction, and a vector in a direction toward the inside is defined as the compression direction.

The reason why the definition is performed as described above is that the dimensions of the actuator section is generally planar (length of height is small enough as compared with the dimension in the plane direction) in the piezoelectric MEMS device, and the stress $\sigma_3$ in the film thickness direction can be regarded as nearly zero. In addition, "stresses in the opposite directions to each other" is determined based on the above-described definition.

<Utilization Configuration and Modification of the Device According to the Second Embodiment>

Similar to the examples in the first embodiment illustrated in FIGS. 7 to 11, in the device according to the second embodiment, all of the piezoelectric conversion sections can be used for driving, or a part of piezoelectric conversion sections can be used for sensing (detection).

Figure 17:
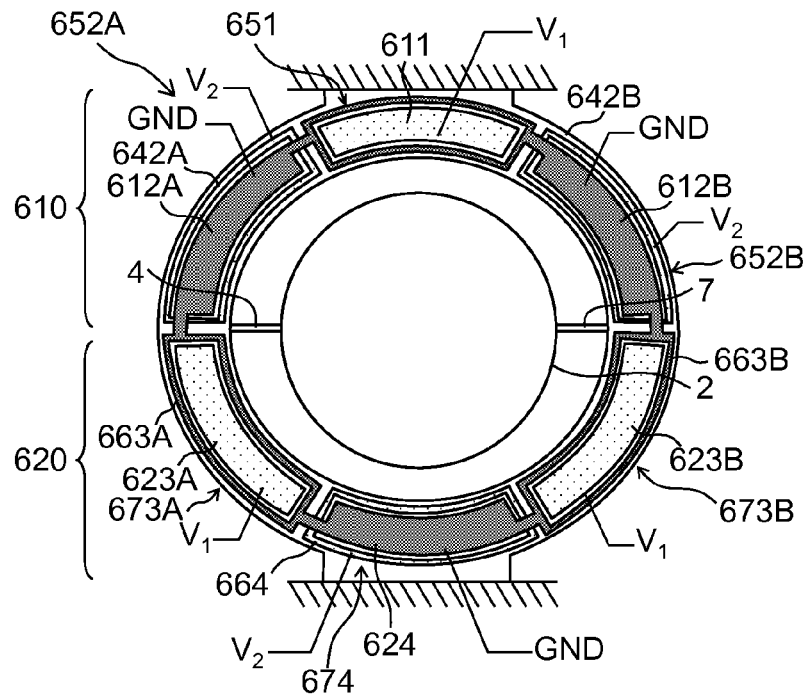
FIG. 17 is a diagram illustrating a voltage application method when all of the electrode sections are used for driving in the device structure of FIG. 15.

FIG. 17 is a diagram illustrating an example in which all of the piezoelectric conversion sections are used as drive electrodes. Here, an example is illustrated in which the drive voltage $V_1$ is applied to the upper electrode sections (611, 623A, and 623B) of the first piezoelectric conversion section 651, and the third piezoelectric conversion sections 673A and 673B that belong to the first group, and the drive voltage $V_2$ having the same phase as the drive voltage $V_1$ is applied to the lower electrode sections (663A, 663B, and 664) of the second piezoelectric conversion sections 652A and 652B, and the fourth piezoelectric conversion section 674 that belong to the second group. It is noted that the drive voltages $V_1$ and $V_2$ can have the same voltage waveform.

Figure 18:
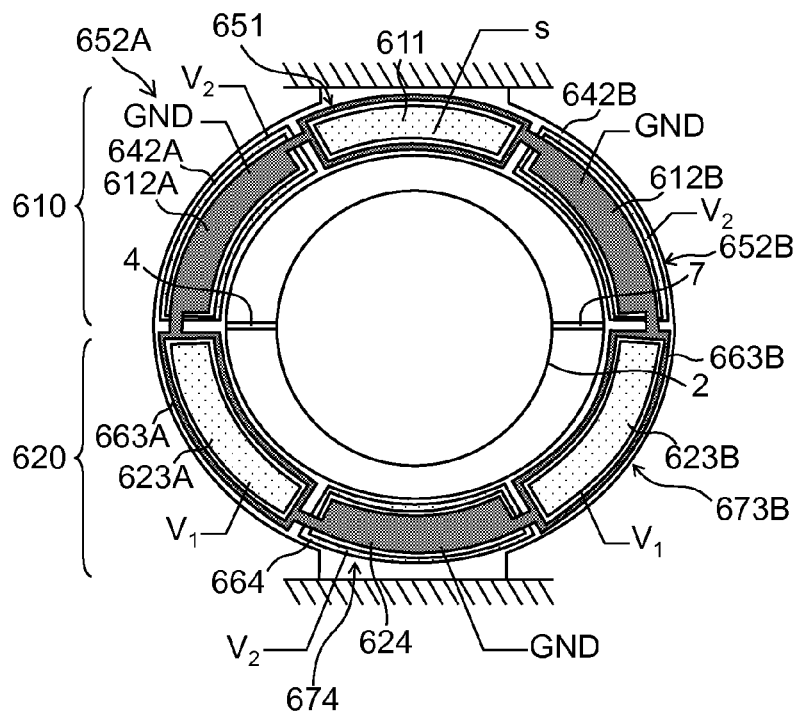
FIG. 18 is a diagram illustrating another configuration in which a part of the electrode sections is used for sensing in the device structure of FIG. 15.

FIG. 18 is a diagram illustrating an example in which a part of piezoelectric conversion sections is used as a sensor. Here, an example is illustrated in which the first upper electrode section 611 in the first actuator section 610 is used as a sensing electrode.

Figure 19:
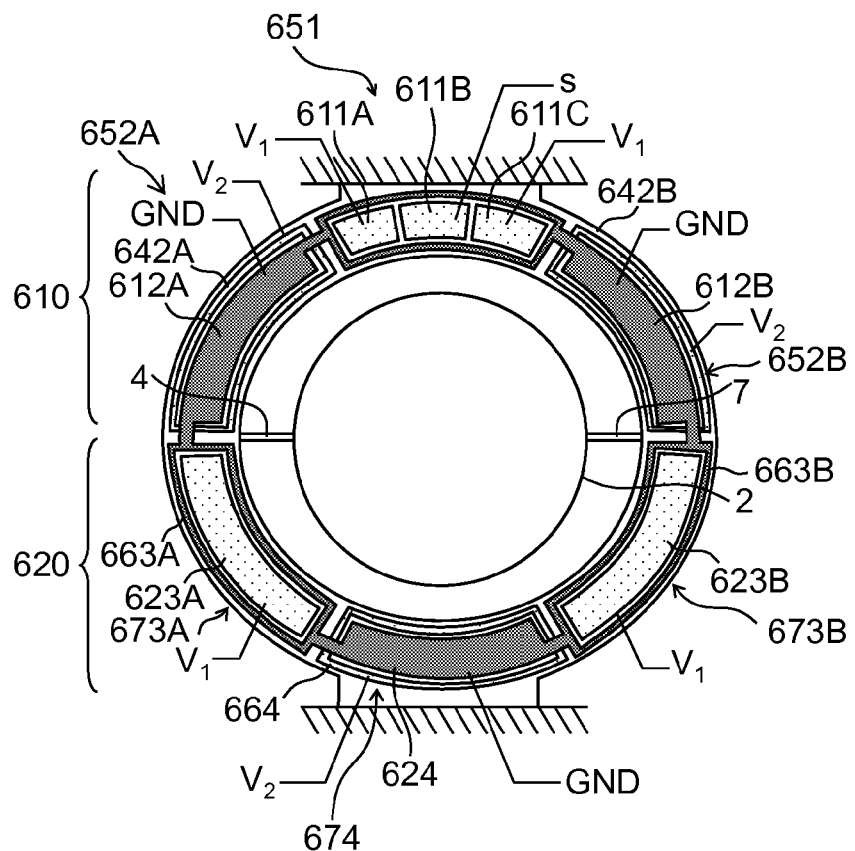
FIG. 19 is a diagram illustrating another configuration in which a part of a plurality of electrodes that constitutes the electrode section is used for sensing.

FIG. 19 is a modification of FIG. 18, and illustrates an example in which the first upper electrode section 611 in FIG. 18 is divided into a plurality of electrodes 611A, 611B, and 611C, and the electrode 611B out of the plurality of electrodes 611A, 611B, and 611C is used as a sensor electrode.

It is noted that a configuration can be also employed in which the fourth piezoelectric conversion section 674 of the second actuator section 620 is used as a sensor section (not illustrated). In this case, the fourth lower electrode section 664 can have a similar structure to the first upper electrode section 611 described in FIGS. 18 and 19.

<Comparative Example 2>

Figure 20:
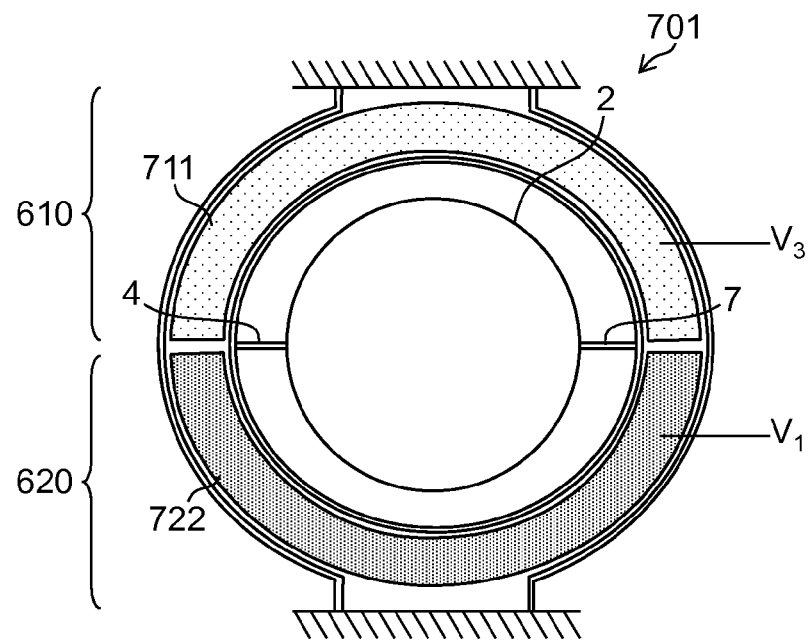
FIG. 20 is a plan view illustrating a structure of a micro scanner device according to a comparative example 2.

A micro scanner device according to a comparative example 2 as illustrated in FIG. 20 is manufactured using a substrate (SOI substrate) and a manufacturing process method that are completely the same as the first embodiment.

In a device 701 illustrated in FIG. 20, the same reference numeral is assigned to an element that is the same as or similar to the structure of FIG. 15, and the description is omitted herein.

The device 701 according to the comparative example 2 has a structure in which the upper electrodes of the first actuator section 610 and the second actuator section 620 only respectively include single electrode sections 711 and 722. In addition, division of the lower electrode is not performed, and the lower electrode corresponds to a single (solid) shared electrode.

FIG. 20 is a diagram illustrating an example in which the two electrode sections 711 and 722 are used as driving electrodes. The drive voltage $V_1$ is applied to the electrode section 722 of the second actuator section 620, and the drive voltage $V_3$ having the opposite phase to the drive voltage $V_1$ is applied to the electrode section 711 of the first actuator section 610.

Figure 21:
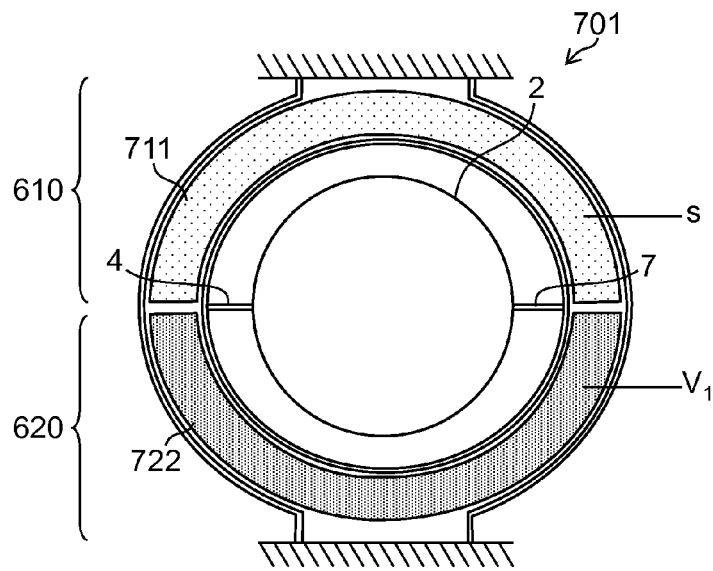
FIG. 21 is a diagram illustrating a configuration in which sensing is performed in the device structure of FIG. 20.

When stress detection is performed in the device configuration illustrated in FIG. 20, one of the two electrode sections 711 and 722 is used for detection (sensing) as illustrated in FIG. 21. In FIG. 21, an example is illustrated in which the electrode section 711 of the first actuator section 610 is used for sensing. The electrode section that is used for sensing is set at a floating potential, and detects voltage that is generated by the positive piezoelectric effect of the piezoelectric body.

<Evaluation Experiment of the Devices According to the Second Embodiment and the Comparative Example 2>

Figure 22:
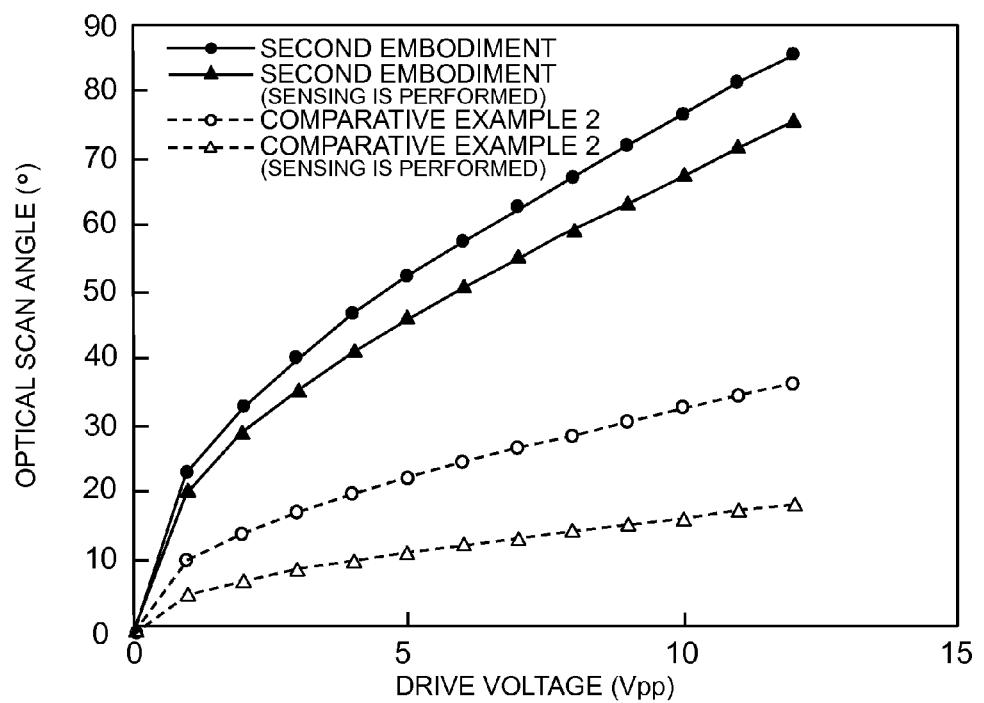
FIG. 22 is a graph illustrating a relationship between applied voltage and an optical scan angle for the second embodiment and the comparative example 2.

An experiment is conducted in which the operation performance of the device that is manufactured in the second embodiment and the operation performance of the device that is manufactured in the comparative example 2 are compared with each other. FIG. 22 is a graph illustrating a relationship between drive voltage and a scan angle in a device that is an experiment target.

As the experiment target, the four types of devices according to "second embodiment", "second embodiment (sensing is performed)", "comparative example 2", and "comparative example 2 (sensing is performed)" are evaluated. Here, "second embodiment" corresponds to the configuration of FIG. 17, and "second embodiment (sensing is performed)" corresponds to the configuration of FIG. 18, and "comparative example 2" corresponds to the configuration of FIG. 20, and "comparative example 2 (sensing is performed)" corresponds to the configuration of FIG. 21.

In each of the devices, the drive voltages $V_1$, $V_2$, and $V_3$ by the sine wave of the voltage amplitude $V_{pp}$ are input to the driving electrode section, and resonant vibration that is associated with a rotation movement of the mirror section 2 (oscillating movement in which rotation is performed around the rotating axis $R_A$) is induced, and a machine deflection angle of the mirror section 2 is measured by a scan angle of laser. In the application method of drive voltage, the devices according to "second embodiment" and "second embodiment (sensing is performed)" are applied correspondingly to the descriptions of FIGS. 17 and 18. The devices according to "comparative example 2" and "comparative example 2 (sensing is performed)" are applied correspondingly to the descriptions of FIGS. 20 and 21. In the second embodiment and the comparative example 2, the resonant frequency is 26 kHz.

The result of the experiment is illustrated in FIG. 22. In FIG. 22, the horizontal axis indicates voltage amplitude (unit of volts [V]), and the vertical axis indicates an optical scan angle (unit of degrees [deg]).

As is apparent from the comparison of FIGS. 22 and 14, the device according to the second embodiment using the tuning-fork type actuator obtains a higher scan angle than the device according to the first embodiment using the cantilever type actuator.

In addition, as illustrated in FIG. 22, the device according to the second embodiment in which the plurality of electrodes sections are included in the single actuator section obtains a higher scan angle than the device according to the comparative example 2. In addition, even when a stress detection section in which a part of the electrode sections is used for sensing is provided, it is confirmed that the device according to the second embodiment ("second embodiment in which sensing is performed") keeps a higher scan angle than the device according to the comparative example 2.

<Waveform of Drive Voltage>

In the above-described first and second embodiments, as the waveforms of the drive voltages $V_1$ and $V_2$, drive waveforms having the same phase are used. The drive voltages $V_1$ and $V_2$ have the same phase (phase difference $\varphi=0°$), but the phases may not be matched with each other completely, and the phase difference may be shifted from 0° to some extent. For example, when a component (noise vibration) other than target resonant vibration occurs, it may be effective that the phase difference between the $V_1$ and the $V_2$ is shifted from 0° by a small amount in order to cancel the component. For example, as long as the phase difference is within a range of ±10°, the phases can be grasped as substantially the same phase.

It is noted that the amplitudes $V_{1A}$ and $V_{2A}$ of the drive voltages may be different from each other, and a given value that includes even 0V can be obtained. In addition, the applied voltage is not limited to the sine wave, and a cycle waveform such as a square wave and a triangle wave can be applied.

In addition, when "$V_1=V_2$" is satisfied, the drive waveform of the device is one type, and a simple drive circuit can be obtained.

Figure 23:
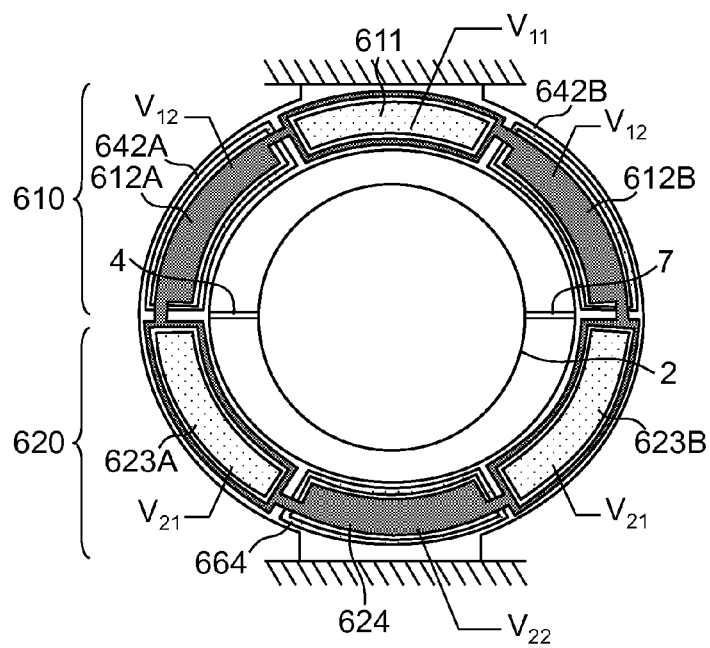
FIG. 23 is a diagram illustrating a case in which four types of drive waveforms are used in the device structure of FIG. 20.

In the embodiment of the presently disclosed subject matter, the number of types of the drive waveforms may be two or more. For example, as illustrated in FIG. 23, drive voltage that is applied to the first upper electrode section 611 can be set at "$V_{11}$", and drive voltage that is applied to the second lower electrode sections 642A and 642B can be set at "$V_{12}$", and drive voltage that is applied to the third upper electrode sections 623A and 623B can be set at "$V_{21}$", and drive voltage that is applied to the fourth lower electrode section 664 can be set at "$V_{22}$".

As the four types of drive voltages, for example, the following waveforms can be used.

$$V_{11}=V_{off11}+V_{11A}\sin\omega t$$

$$V_{12}=V_{off12}+V_{12A}\sin\omega t$$

$$V_{21}=V_{off21}+V_{21A}\sin\omega t$$

$$V_{22}=V_{off22}+V_{22A}\sin\omega t$$

In the above-described formulae, "$V_{11}$", "$V_{12A}$", "$V_{21A}$", and "$V_{22A}$" are voltage amplitudes, and "$\omega$" is an angular frequency, and "t" is a time.

In, "$V_{11A}$", "$V_{12A}$", "$V_{21A}$", and "$V_{22A}$", a given value of 0 or more can be obtained. To, "$V_{11A}$," "$V_{12A}$," "$V_{21A}$," and "$V_{22A}$", different values can be set, and the same value can be set to a part or all of "$V_{11A}$," "$V_{12A}$," "$V_{21A}$," and "$V_{22A}$". In addition, in the above-described formulas, the phases of "$V_{11}$" and "$V_{21}$" are matched with each other, and the phases of "$V_{12}$" and "$V_{22}$" may be matched with each other but not completely, and a slight phase shift of about ±10° is permissible.

<Displacement Angle at the Time of Application of Direct Current (DC) Voltage>

The devices according to the first embodiment and the second embodiment can obtain a high displacement amount even when driving in the non-resonant mode is performed. That is, driving can be performed even with a frequency that is low enough as compared with a resonant frequency without usage of resonant.

Figure 24:
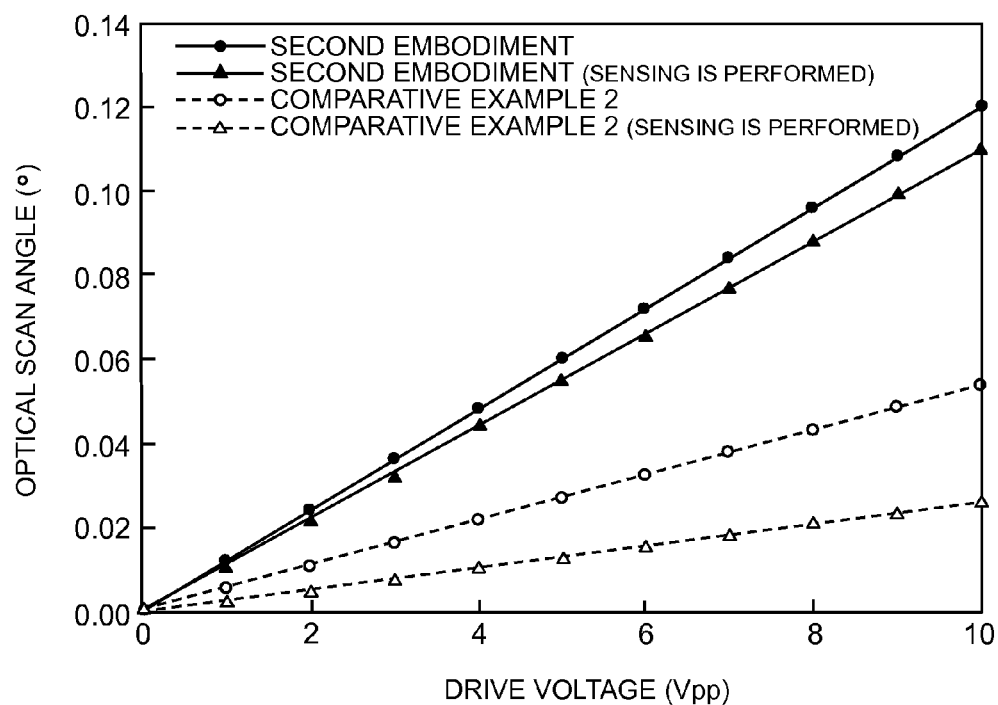
FIG. 24 is a graph illustrating a relationship between applied voltage and an optical scan angle for the second embodiment and the comparative example 2 when direct current (DC) voltage is applied.

FIG. 24 is a graph illustrating an experiment result of measurement of a displacement angle when driving is performed by applying DC voltage (at the time of non-resonance driving) for the devices according to the second embodiment and the comparative example 2. The horizontal axis indicates drive voltage, and the vertical axis indicates an optical scan angle. FIG. 24 illustrates a displacement angle when a voltage waveform (square wave) of 1 kHz is applied for the structure in the second embodiment and the comparative example 2. In this experiment, offset voltage is applied so as not to exceed a coercive field of the piezoelectric body.

As illustrated in FIG. 24, in the second embodiment, a high displacement amount is obtained as compared with the comparative example 2.

<Dimension Example in the Second Embodiment>

Figure 25:
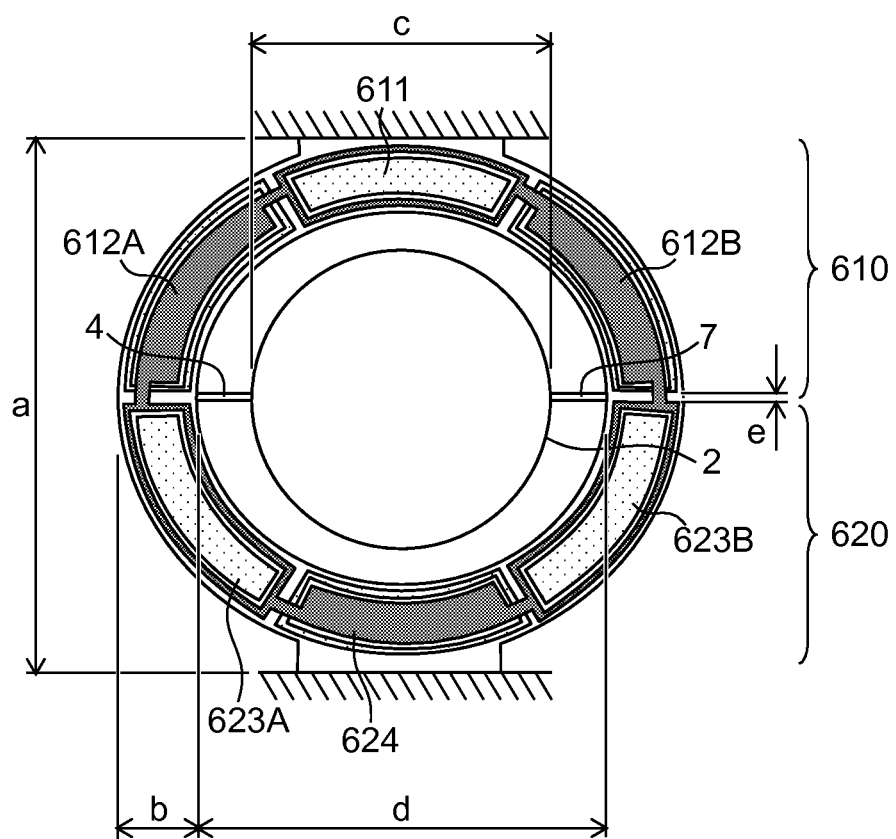
FIG. 25 is a diagram illustrating a dimension example of the device according to the second embodiment.

As an example of the shape of the device, a specific example of each of the dimensions in the second embodiment is illustrated in FIG. 25. In the piezoelectric actuator section, the whole length "a" is 2.3 mm, and the width "b" of the arm section of the actuator is 0.4 mm, the diameter "c" of the mirror section is 1.2 mm, and the horizontal width "d" between the coupling sections of the torsion bar section is 1.7 mm, and the thickness "e" of the torsion bar section is 0.16 mm Evaluation experiments in FIGS. 22 and 24 are conducted using the device having the above-described dimension.

<Supply Device (Drive Control Section) of Drive Voltage>

FIG. 26 is a diagram illustrating a structure example of a control system that is used for driving of the device. Here, a control system of the device configuration according to the second embodiment illustrated in FIG. 18 is illustrated. In the case of the configuration illustrated in FIG. 18, as illustrated in FIG. 26, each of the second lower electrode sections 642A and 642B of the first actuator section 610, and the third upper electrode sections 623A and 623B, and the fourth lower electrode section 664 of the second actuator section 620, which are used for driving, is connected to a voltage output terminal to which a drive circuit 810 corresponds.

The drive voltage $V_1$ is supplied to the third upper electrode sections 623A and 623B of the second actuator section 620 from the drive circuit 810. The drive voltage $V_2$ is supplied to the second lower electrode sections 642A and 642B of the first actuator section 610 and the fourth lower electrode section 664 of the second actuator section 620 from the drive circuit 810. It is noted that, in FIG. 26, the electrode sections to which the same drive voltage is applied are connected to each other in parallel, but individual drive voltage may be supplied to each of the electrode sections.

The drive circuit 810 supplies the drive voltages $V_1$ and $V_2$ that are used to cause the mirror section 2 to perform resonance driving in the vicinity of a resonant frequency fx of the resonant mode in which the mirror section 2 performs the rotation movement around the rotating axis $R_A$.

In addition, the first upper electrode section 611 of the first actuator section 610, which is used for sensing, is connected to a detection circuit 812.

Each of the first lower electrode section 641, and the second upper electrode sections 612A and 612B of the first actuator section 610, and the third lower electrode sections 663A and 663B, and the fourth upper electrode section 624 of the second actuator section 620 is connected to a shared terminal of the drive circuit 810 or the detection circuit 812 ($V_0$ terminal, for example, a GND terminal). Each of the electrodes is connected to the drive circuit 810 or the detection circuit 812 through a pattern wiring section or a wiring member such as wire bonding on the substrate, which is not illustrated.

A voltage signal is detected from the first upper electrode section 611 through the detection circuit 812, and the detection result is notified to a control circuit 814. The control circuit 814 transmits a control signal to the drive circuit 810 so as to keep the resonance based on the signal that is transmitted from the detection circuit 812, and controls application of drive voltage to the first actuator section 610 and the second actuator section 620.

For example, feedback to the drive circuit 810 is performed so that the phase of the waveform of the drive voltage that is applied to the piezoelectric actuator section and the phase of the waveform that is detected from the stress detection section (sensor section) become a certain value to keep the resonance. The control circuit 814 controls voltage that is applied to the piezoelectric actuator section or a drive frequency based on the detection signal that is obtained from the stress detection section.

Such a feedback control circuit can be incorporated into the detection circuit 812. In addition, the drive circuit 810, the detection circuit 812, and the control circuit 814 can be configured together as an integrated circuit such as an application specific integrated circuit (ASIC).

<Action Effect of the Embodiments>

In the embodiments of the presently disclosed subject matter that includes the above-described first and second embodiments, the structure is employed in which division of the upper electrode and the lower electrode of the actuator section is performed based on stress distribution of principal stresses at the time of resonant mode vibration, which is grasped from simulation analysis of the device correspondingly to the compression direction area and the tensile direction area in which the stress directions are opposite directions to each other, and by providing the piezoelectric conversion section of the first group and the piezoelectric conversion section of the second group in which driving forces having different phases are generated, driving can be performed efficiently, and a high displacement angle can be obtained.

In addition, the actuator section can be used as the stress detection section that detects a potential as which a part or all of the electrodes that constitute one of electrode sections are set as a floating potential.

In this case, the stress detection section cannot generate driving force, but still can keep a high scan angle as compared with the structure in the related art.

In addition, in the embodiment, driving can be performed using the drive waveforms having the same phase, so that the structure of the drive circuit can be simplified.

<Modification of the Mirror Supporting Section>

In the above-described embodiment, the first torsion bar section 4 and the second torsion bar section 7 are connected to a portion that is to be matched with the rotating axis $R_A$ of the mirror section 2, and extend in the axial direction of the rotating axis $R_A$ toward the outside of the mirror section 2. In the first and second embodiments, the example is described above in which the first torsion bar section 4 and the second torsion bar section 7 are connected to the position that is matched with the rotating axis $R_A$ of the mirror section 2, but the connection position of the torsion bar section may not be strictly matched with the rotating axis $R_A$, and is not limited to the configuration of one connection position, and a plurality of connection positions may be employed.

For example, when an approximately center portion in the longitudinal direction of the mirror section 2 (true center point on the design and the surrounding and neighborhood of the center point) is the rotating axis $R_A$, in addition to the configuration in which the torsion bar is supported so as to be connected to one position that is approximately matched with the rotating axis $R_A$ and, a configuration can be employed in which the torsion bar is connected to two locations or more so as to have axis symmetry across the position of the rotating axis $R_A$ in a range that is approximately regarded as the center portion.

FIG. 27 illustrates an example in which torsion bar sections 4A, 4B, 7A, and 7B each two of which are located on one side are provided instead of the first torsion bar section 4 and the second torsion bar section 7 in FIG. 1. In FIG. 27, the same reference numeral is assigned to an element that is the same as or similar to the structure illustrated in FIG. 1, and the description is omitted herein.

<Other Modifications>

In FIG. 1, the structure is described above the first torsion bar section 4 is connected to the coupling section 15 in which the first actuator section 11 is coupled to the second actuator section 22, but a configuration can be employed in which the first actuator section 11 and the second actuator section 22 are separated. FIG. 28 illustrates such an example.

In FIG. 28, the same reference numeral is assigned to a member that is the same as or similar to the structure FIGS. 1 and 27, and the description is omitted herein. As illustrated in FIG. 28, the first actuator section 11 and the second actuator section 22 are configured as cantilever structures so as to be independent of each other, and the torsion bar section 4A is connected to the distal end of the first actuator section 11, and the torsion bar section 4B is connected to the distal end of the second actuator section 22.

Similarly, the third actuator section 31 and the fourth actuator section 42 are configured as the cantilever structures so as to be independent of each other, and the torsion bar section 7A is connected to the distal end of the third actuator section 31, and the torsion bar section 7B is connected to the distal end of the fourth actuator section 42. In such a structure, mirror driving that is similar to that of FIGS. 1 and 27 can be performed.

<Application Example>

The mirror drive device according to the presently disclosed subject matter can be used for various purposes as an optical device that reflects light such as laser light and changes a traveling direction of the light. For example, the mirror drive device can be widely applied to an optical deflector, an optical scanning device, a laser printer, a bar code reader, a display device, various optical sensors (distance measuring sensor and shape measurement sensor), an optical communication device, a laser projector, an optical interference tomographic image diagnostic apparatus, etc.

It is noted that the presently disclosed subject matter is not limited to the above-described embodiments, and various modifications can be made by those of ordinary skill in the art without departing from the teachings of the presently disclosed subject matter.

What is claimed is:

1. A mirror drive device comprising:
a mirror section that includes a reflective surface configured to reflect light;
a mirror supporting section that is connected to the mirror section, the mirror supporting section configured to support the mirror section so that the mirror section rotates around a rotating axis;
a piezoelectric actuator section that is connected to the mirror supporting section, the piezoelectric actuator section configured to generate a driving force that causes the mirror section to rotate around the rotating axis; and
a fixture section configured to support the piezoelectric actuator section,
wherein the piezoelectric actuator section has a lamination structure in which a diaphragm, a lower electrode, a piezoelectric body, and an upper electrode are laminated in this order, and includes a first actuator section and a second actuator section that are piezoelectric unimorph actuators that are deformed by an inverse piezoelectric effect of the piezoelectric body obtained by applying a drive voltage,
the first actuator section and the second actuator section are arranged on both sides of a direction perpendicular to the rotating axis so that the first actuator section and the second actuator section sandwich the rotating axis from the direction perpendicular to the rotating axis in a plan view,
from among the both sides the of the direction perpendicular to the rotating axis with respect to a connection portion with the mirror supporting section, the first actuator section is arranged on one side, and the second actuator section is arranged on another side,
a first base end section on an opposite side to the mirror supporting section in the first actuator section, and a second base end section on an opposite side to the mirror supporting section in the second actuator section are fixed to the fixture section,
tilting drive is performed on the mirror supporting section by bending the first actuator section and the second actuator section in opposite directions to each other,
the upper electrode of the first actuator section includes a first upper electrode section and a second upper electrode section that are insulated and separated from each other, and the first upper electrode section and the second upper electrode section are arranged in parallel along a longitudinal direction of a shape from the first base end section of the first actuator section to a connection portion with the mirror supporting section,
the lower electrode of the first actuator section includes a first lower electrode section that faces the first upper electrode section and a second lower electrode section that faces the second upper electrode section, and the first lower electrode section and the second lower electrode section are insulated and separated from each other,
the first actuator section includes a first piezoelectric conversion section that is constituted by the first upper electrode section and the first lower electrode section as an electrode pair, and a second piezoelectric conversion section that is constituted by the second upper electrode section and the second lower electrode section as an electrode pair,
the upper electrode of the second actuator section includes a third upper electrode section and a fourth upper electrode section that are insulated and separated from each other, and the third upper electrode section and the fourth upper electrode section are arranged in parallel along a longitudinal direction of a shape from the second base end section of the second actuator section to a connection portion with the mirror supporting section,
the lower electrode of the second actuator section includes a third lower electrode section that faces the third upper electrode section and a fourth lower electrode section that faces the fourth upper electrode section, and the third lower electrode section and the fourth lower electrode section are insulated and separated from each other,
the second actuator section includes a third piezoelectric conversion section that is constituted by the third upper electrode section and the third lower electrode section as an electrode pair, and a fourth piezoelectric conversion section that is constituted by the fourth upper electrode section and the fourth lower electrode section as an electrode pair,
an arrangement configuration of the first upper electrode section, the second upper electrode section, the third upper electrode section, and the fourth upper electrode section corresponds to stress distribution of a principal stress in an in-plane direction that is perpendicular to a film thickness direction of the piezoelectric body in a resonant mode vibration that is associated with tilting displacement of the mirror section due to the rotation around the rotating axis, and
stresses in opposite directions to each other are generated between a piezoelectric body portion that corresponds to positions of the first upper electrode section and the third upper electrode section, and a piezoelectric body portion that corresponds to positions of the second upper electrode section and the fourth upper electrode section, in the resonant mode vibration, and
wherein each of the first piezoelectric conversion section, the second piezoelectric conversion section, the third piezoelectric conversion section, and the fourth piezoelectric conversion section functions as a driving force generation section to which the drive voltage is applied, and at least one of the four upper electrode sections or the lower electrode sections of a piezoelectric conversion section which is nearer to the first base end section from among the first piezoelectric conversion section and the second piezoelectric conversion section of the first actuator section is divided to three electrodes, and at least one of another of the pairs of the four upper electrode sections and the lower electrode sections are undivided, and
one electrode of the three electrodes is used as an electrode section for detecting a voltage generated by a piezoelectric effect that is associated with a deformation of the piezoelectric body, and a drive voltage having a same phase is applied to other two electrodes of the three electrode.

2. The mirror drive device according to claim 1,
wherein the first actuator section and the second actuator section are connected to each other, and
the mirror supporting section is coupled to a coupling section of the first actuator section and the second actuator section.

3. The mirror drive device according to claim 1, further comprising a first mirror supporting section and a second mirror supporting section that support the mirror section from both sides of the rotating axis in an axial direction, as the mirror supporting section.

4. The mirror drive device according to claim 1, wherein the first actuator section and the second actuator section include cantilever structures in which the first base end section and the second base end section that are fixed to the fixture section are used as fixture ends.

5. The mirror drive device according to claim 1, wherein the first actuator section and the second actuator section are actuator sections having a tuning-fork shape in which two arm sections that are arranged so as to be divided on both sides of the mirror sections are provided, and the second base end section leading out of a portion at which the arm sections are joined and the fixture section are connected to each other at only one position, the piezoelectric actuator section has a circular structure in which an arm section of the first actuator section is connected to an arm section of the second actuator section, the mirror drive device has a first mirror supporting section and a second mirror supporting section that support the mirror section from both sides of the rotating axis in an axial direction, as the mirror supporting section, and the mirror supporting section is connected to a connection portion of the first actuator section and the second actuator section.

6. The mirror drive device according to claim 1, further comprising:
a drive circuit configured to supply a driving voltage to an electrode that is included in the upper electrode section of each of the first piezoelectric conversion section and the third piezoelectric conversion section, and supply a driving voltage to an electrode that is included in the lower electrode section of each of the second piezoelectric conversion section and the fourth piezoelectric conversion section, wherein a phase of the drive voltage that is applied to the electrode that constitutes the upper electrode section of each of the first piezoelectric conversion section and the third piezoelectric conversion section is same as a phase of the drive voltage that is applied to the lower electrode section of each of the second piezoelectric conversion section and the fourth piezoelectric conversion section.

7. The mirror drive device according to claim 1, further comprising:
a detection circuit configured to detect a voltage that is generated by a piezoelectric effect that is associated with a deformation of a piezoelectric body, from the one electrode of three electrodes, the one electrode being used as an electrode section for detecting and set at a floating potential.

8. The mirror drive device according to claim 1, further comprising:
a drive circuit configured to supply a drive voltage to the piezoelectric actuator section, and supply the drive voltage that causes resonance driving of the mirror section near a resonant frequency fx of a resonant mode in which the mirror section performs a rotation movement around the rotating axis.

9. The mirror drive device according to claim 1, wherein the piezoelectric body that is used for the piezoelectric actuator section is a thin film that has 1 to 10 μm thickness and is formed on a substrate that is a diaphragm by a vapor-phase growth method or a sol-gel method.

10. The mirror drive device according to claim 1, wherein the piezoelectric body that is used for the piezoelectric actuator section is one or more kinds of perovskite-type oxides that are represented by a following formula (P)

$$\text{general formula } ABO_3 \tag{P}$$

in the formula, "A" is an element of A-site, and at least one element including Pb, and "B" is an element of B-site, and at least one type of element selected from a group including Ti, Zr, V, Nb, Ta, Sb, Cr, Mo, W, Mn, Sc, Co, Cu, In, Sn, Ga, Zn, Cd, Fe, and Ni, and "O" is an oxygen element, and a standard molar ratio between the A-site element, the B-site element, and the oxygen element is 1:1:3, and a molar ratio is to be deviated from the standard molar ratio within a range in which a perovskite structure is obtained.

11. The mirror drive device according to claim 1, wherein the piezoelectric body that is used for the piezoelectric actuator section is one or more kinds of perovskite-type oxides that are represented by a following formula (PX)

$$A_a\,(Zr_x,Ti_y,M_{b-x-y})_b\,O_c \tag{PX}$$

in the formula, "A" is an element of A-site, and at least one element including Pb, and "M" is at least one type of element selected from a group including V, Nb, Ta, and Sb, and "0<x<b", "0<y<b", and "0≤b-x-y" are satisfied, and "a:b:c=1:1:3" is a standard molar ratio, and a molar ratio is to be deviated from the standard molar ratio within a range in which a perovskite structure is obtained.

12. The mirror drive device according to claim 11, wherein a perovskite-type oxide (PX) includes Nb, and "Nb/(Zr+Ti+Nb)" molar ratio is 0.06 or more to 0.20 or less.

13. A mirror driving method in the mirror drive device according to claim 1 comprising:
bending the first actuator section and the second actuator section in opposite directions to each other by applying a first drive voltage to an electrode that is included in each of the first piezoelectric conversion section and the third piezoelectric conversion section, and applying a second drive voltage that has a same phase as the first drive voltage, to an electrode that is included in each of the second piezoelectric conversion section and the fourth piezoelectric conversion section.

14. The mirror driving method according to claim 13, wherein a part of the upper electrode sections and the lower electrode sections of the first piezoelectric conversion section, the second piezoelectric conversion section, the third piezoelectric conversion section, and the fourth piezoelectric conversion section are used as a detection electrode that detects a voltage that is generated by a piezoelectric effect that is associated with a deformation of the piezoelectric body, and a detection signal is obtained from the detection electrode during driving of the mirror section.

15. The mirror drive device according to claim 3, wherein the first mirror supporting section is connected to one side of both sides of the direction of the rotating axis of the mirror section, and the second first supporting section is connected to another side, the piezoelectric actuator section includes a third actuator section and a fourth actuator section that are deformed by an inverse piezoelectric effect of the piezoelectric body obtained by applying a drive voltage, the first actuator section and the second actuator section are connected to the first mirror supporting section, the third actuator section and the fourth actuator section are connected to the second mirror supporting section, the first actuator section is arranged on one side of the both sides of the direction perpendicular to the rotating axis with respect to a connection portion with the first mirror supporting section, and the second actuator section is arranged on another side, the first base end section on the opposite side to the first mirror supporting section in the first actuator section and the second base end section on the opposite side to the first mirror supporting section in the second actuator section are fixed to the fixture section, respectively, the third actuator section and the fourth actuator section are arranged on the both sides of the direction perpendicular to the rotating axis so that the third actuator section and the fourth actuator section sandwich the rotating axis from the direction perpendicular to the rotating axis in a plan view, the third actuator section is arranged on one side of the both sides of the direction perpendicular to the rotating axis with respect to a connection portion with the second mirror supporting section, and the fourth actuator section is arranged on another side, the third base end section on the opposite side to the second mirror supporting section in the third actuator section and the fourth base end section on the opposite side to the second mirror supporting section in the fourth actuator section are fixed to the fixture section, respectively, tilting drive is performed on the second mirror supporting section by bending the third actuator section and the fourth actuator section in opposite directions to each other, the upper electrode of the third actuator section includes a fifth upper electrode section and a sixth upper electrode section that are insulated and separated from each other, and the fifth upper electrode section and the sixth upper electrode section are arranged in parallel along a longitudinal direction of a shape from the third base end section of the third actuator section to a connection portion with the mirror supporting section, the lower electrode of the third actuator section includes a fifth lower electrode section that faces the fifth upper electrode section and a sixth lower electrode section that faces the sixth upper electrode section, and the fifth lower electrode section and the sixth lower electrode section are insulated and separated from each other, the third actuator section includes a fifth piezoelectric conversion section that is constituted by the fifth upper electrode section and the fifth lower electrode section as an electrode pair, and a sixth piezoelectric conversion section that is constituted by the sixth upper electrode section and the sixth lower electrode section as an electrode pair, the upper electrode of the fourth actuator section includes a seventh upper electrode section and an eighth upper electrode section that are insulated and separated from each other, and the seventh upper electrode section and the eighth upper electrode section are arranged in parallel along a longitudinal direction of a shape from the fourth base end section of the fourth actuator section to a connection portion with the mirror supporting section, the lower electrode of the fourth actuator section includes a seventh lower electrode section that faces the seventh upper electrode section and an eighth lower electrode section that faces the eighth upper electrode section, and the seventh lower electrode section and the eighth lower electrode section are insulated and separated from each other, the fourth actuator section includes a seventh piezoelectric conversion section that is constituted by the seventh upper electrode section and the seventh lower electrode section as an electrode pair, and an eighth piezoelectric conversion section that is constituted by the eighth upper electrode section and the eighth lower electrode section as an electrode pair, an arrangement configuration of the fifth upper electrode section, the sixth upper electrode section, the seventh upper electrode section, and the eighth upper electrode section corresponds to stress distribution of a principal stress in an in-plane direction that is perpendicular to the film thickness direction of the piezoelectric body in a resonant mode vibration that is associated with tilting displacement of the mirror section due to the rotation around the rotating axis, and stresses in opposite directions to each other are generated between a piezoelectric body portion that corresponds to positions of the fifth upper electrode section and the seventh upper electrode section, and a piezoelectric body portion that corresponds to positions of the sixth upper electrode section and the eighth upper electrode section, in the resonant mode vibration, and wherein each of the fifth piezoelectric conversion section, the sixth piezoelectric conversion section, the seventh piezoelectric conversion section, and the eighth piezoelectric conversion section functions as a driving force generation section to which the drive voltage is applied, and an upper electrode section or a lower electrode of a piezoelectric conversion section which is nearer to the third base end section from among the fifth piezoelectric conversion section and the sixth piezoelectric conversion section of the third actuator section is divided to three electrodes, one electrode of the three electrodes of the third actuator section is used as an electrode section for detecting a voltage generated by a piezoelectric effect that is associated with a deformation of the piezoelectric body, other two electrodes of the third actuator section are used as electrodes for drive, and a drive voltage having a same phase is applied to the other two electrodes of the third actuator section.

16. The mirror drive device according to claim 15, further comprising a detection circuit configured to detect a voltage that is generated by a piezoelectric effect that is associated with a deformation of a piezoelectric body, from the one electrode of three electrodes of the third actuator section, the one electrode of three electrodes of the third actuator section being used as an electrode section for detecting and set at a floating potential.

* * * * *